(12) United States Patent
Huang et al.

(10) Patent No.: US 12,355,446 B2
(45) Date of Patent: *Jul. 8, 2025

(54) DATA RETENTION CIRCUIT AND METHOD

(71) Applicant: TAIWAN SEMICONDUCTOR MANUFACTURING COMPANY, LTD., Hsinchu (TW)

(72) Inventors: Kai-Chi Huang, Hsinchu (TW); Yung-Chen Chien, Hsinchu (TW); Chi-Lin Liu, Hsinchu (TW); Wei-Hsiang Ma, Hsinchu (TW); Jerry Chang Jui Kao, Hsinchu (TW); Shang-Chih Hsieh, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 55 days.

This patent is subject to a terminal disclaimer.

(21) Appl. No.: 18/363,192

(22) Filed: Aug. 1, 2023

(65) Prior Publication Data
US 2023/0387894 A1    Nov. 30, 2023

Related U.S. Application Data

(63) Continuation of application No. 17/815,679, filed on Jul. 28, 2022, now Pat. No. 11,757,435, which is a
(Continued)

(51) Int. Cl.
*H03K 3/037*    (2006.01)
*G06F 1/3237*   (2019.01)
(Continued)

(52) U.S. Cl.
CPC ......... *H03K 3/0375* (2013.01); *G06F 1/3237* (2013.01); *H03K 3/0372* (2013.01); *H03K 3/356086* (2013.01); *H03K 19/0016* (2013.01)

(58) Field of Classification Search
CPC ............... H03K 3/0372; H03K 3/0375; H03K 3/356086; H03K 3/356104; H03K 3/26; H03K 19/0016
See application file for complete search history.

(56) References Cited

U.S. PATENT DOCUMENTS 6,157,693 A    12/2000   Jayaraman
7,746,139 B2    6/2010   Mo
(Continued)

FOREIGN PATENT DOCUMENTS

CN    101512900    8/2009
JP    2002185307    6/2002
(Continued)

OTHER PUBLICATIONS

Office Action dated Mar. 30, 2020 from corresponding application No. TW 108111767.
(Continued)

*Primary Examiner* — Sibin Chen
(74) *Attorney, Agent, or Firm* — Hauptman Ham, LLP

(57) ABSTRACT

A circuit includes a first power node having a first voltage level, a second power node having a second voltage level different from the first voltage level, a reference node having a reference voltage level, a master latch that outputs a first bit based on a received bit, a slave latch that outputs a second bit based on the first bit and an output bit based on a selected one of the first bit or a third bit, a first level shifter that outputs the third bit based on a complementary bit pair, and a retention latch including a second level shifter and a pair of inverters that outputs the complementary bit pair based on the second bit. The slave latch and the first level shifter are coupled between the first power and reference nodes, and the retention latch is coupled between the second power and reference nodes.

20 Claims, 9 Drawing Sheets

Related U.S. Application Data continuation of application No. 17/314,370, filed on May 7, 2021, now Pat. No. 11,456,728, which is a continuation of application No. 16/294,726, filed on Mar. 6, 2019, now Pat. No. 11,012,057.

(60) Provisional application No. 62/651,946, filed on Apr. 3, 2018.

(51) Int. Cl.
*H03K 3/356* (2006.01)
*H03K 19/00* (2006.01)

(56) References Cited

U.S. PATENT DOCUMENTS

| | | | |
|---|---|---|---|
| 9,473,113 B1* | 10/2016 | Pant | H03K 3/356008 |
| 2008/0054980 A1 | 3/2008 | Bajkowski et al. | |
| 2008/0238510 A1 | 10/2008 | Aksamit | |
| 2009/0262588 A1 | 10/2009 | Vilangudipitchai et al. | |
| 2012/0026783 A1 | 2/2012 | Jung et al. | |
| 2016/0065188 A1 | 3/2016 | Singhal | |
| 2016/0241219 A1* | 8/2016 | Kim | G01R 31/31723 |
| 2016/0373092 A1 | 12/2016 | Storms et al. | |
| 2017/0012611 A1 | 1/2017 | Escobar et al. | |
| 2017/0194949 A1 | 7/2017 | Srivastava et al. | |
| 2019/0305761 A1* | 10/2019 | Huang | H03K 3/35625 |
| 2020/0212896 A1* | 7/2020 | Purushothaman | H03K 3/35625 |

FOREIGN PATENT DOCUMENTS

| | | |
|---|---|---|
| TW | 200603043 | 1/2006 |
| TW | 200701640 | 1/2007 |
| TW | 201711392 | 3/2017 |

OTHER PUBLICATIONS

Office Action dated Dec. 2, 2021 from corresponding application No. TW 11021190710 (pp. 1-7).

* cited by examiner

DATA RETENTION CIRCUIT AND METHOD

PRIORITY CLAIM

The present application is a continuation of U.S. application Ser. No. 17/815,679, filed Jul. 28, 2022, now U.S. Pat. No. 11,757,435, issued Sep. 12, 2023, which is a continuation of U.S. application Ser. No. 17/314,370, filed May 7, 2021, now U.S. Pat. No. 11,456,728, issued Sep. 27, 2022, which is a continuation of U.S. application Ser. No. 16/294,726, filed Mar. 6, 2019, now U.S. Pat. No. 11,012,057, issued May 18, 2021, which claims the priority of U.S. Provisional Application No. 62/651,946, filed Apr. 3, 2018, each of which is incorporated herein by reference in its entirety.

BACKGROUND

Electronic circuits sometimes include one or more portions that are powered down while not in use to conserve energy and prolong battery life. To provide continuity, data bits are often saved prior to a power down event, then restored to their previous circuit locations once the powered down portion has been powered on again. The data bits typically are saved using latch circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
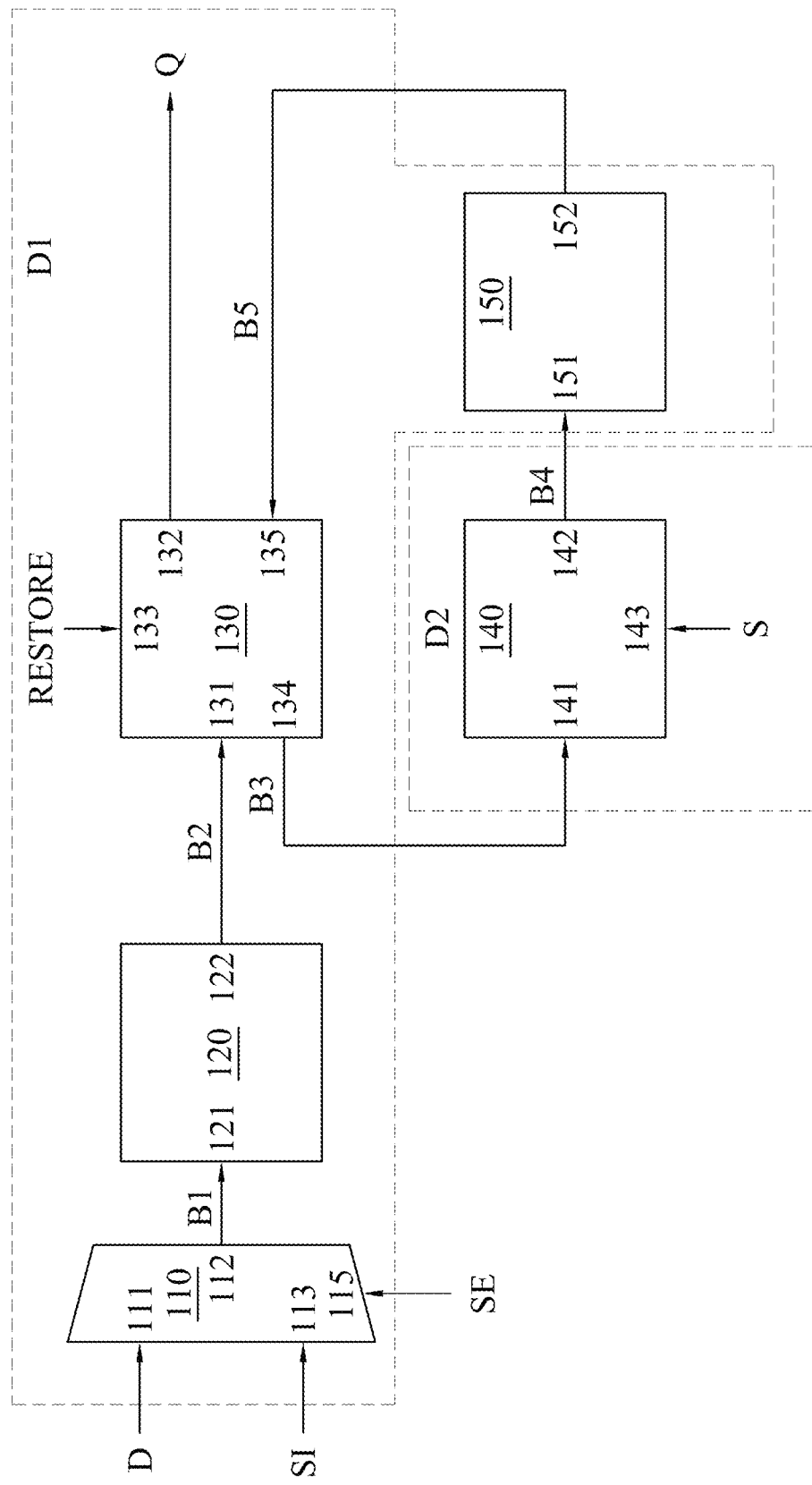
FIG. 1 is a diagram of a data retention circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A data retention circuit includes a master latch, a slave latch, and a retention latch, also referred to as a balloon latch. The master and slave latches are configured to operate in a first power domain having a first power supply voltage level, and the retention latch is configured to operate in a second power domain having a second power supply voltage level independent of the first power supply voltage level. The retention latch is configured to shift a logical level from the first power supply voltage level to the second power supply voltage level, and the data retention circuit includes a level shifter in the first power domain configured to shift a logical level from the second power supply voltage level to the first power supply voltage level.

The data retention circuit is thereby capable of retaining a data bit during periods when the first power domain is powered down by operating the retention latch using the second power supply voltage level. By being capable of using the second power supply voltage level different from the first power supply voltage level, the data retention circuit has increased flexibility with respect to both circuit applications and placement within an integrated circuit (IC) layout compared to approaches that do not use a second power supply voltage level different from a first power supply voltage level.

FIG. 1 is a diagram of a data retention circuit 100, in accordance with some embodiments. Data retention circuit 100 is an electronic circuit configured to receive data bits D and SI in a power domain D1, output a latched data bit Q representative of one of the received data bits in power domain D1 responsive to a select signal SE and one or more clock signals (not shown), and retain a data bit representative of the one of received data bits D or SI in a power domain D2, separate from power domain D1.

In various embodiments, data retention circuit 100 is referred to as a flip-flop circuit, a retention flip-flop circuit, a retention flop circuit, a balloon flip-flop circuit, or a balloon flop circuit. In some embodiments, data retention circuit 100 is an IC, e.g., a data retention IC 200 discussed below with respect to FIG. 2.

Power domain D1 is a first portion of a circuit (not shown) in which data retention circuit 100 is configured to operate. Power domain D1 includes a first power distribution apparatus including one or more first power nodes, e.g., a power node V1N discussed below with respect to FIG. 2, and one or more first reference nodes (not shown in FIG. 1), e.g., reference nodes VSSN discussed below with respect to FIG. 2, configured to supply power in a power on mode and a power down mode.

Power domain D2 is a second portion of the circuit in which data retention circuit 100 is configured to operate. Power domain D2 includes a second power distribution apparatus including one or more second power nodes, e.g., a power node V2N discussed below with respect to FIG. 2, and one or more second reference nodes (not shown in FIG. 1), e.g., reference nodes VSSN discussed below with respect to FIG. 2, configured to supply power in the power on mode.

In the power on mode, the one or more first power nodes of power domain D1 have a first power supply voltage level, e.g., a power supply voltage level VDD1 discussed below with respect to FIGS. 2-8, relative to a reference voltage level, e.g., a ground or a reference voltage level VSS discussed below with respect to FIGS. 2-8, on the one or more first reference nodes. In the power down mode, the one or more first power nodes of power domain D1 have a power down voltage level at or near the reference voltage level.

In the power on mode, the one or more second power nodes of power domain D2 are configured to have a second power supply voltage level, e.g., a power supply voltage level VDD2 discussed below with respect to FIGS. 2-8, relative to the reference voltage level. The circuit in which data retention circuit is configured to operate includes power domain D2 configured to operate in the power on mode during periods when power domain D1 is operating in the power on mode and during periods when power domain D1 is operating in the power down mode.

In various embodiments, the second power supply voltage level of power domain D2 is less than, equal to, or greater than the first power supply voltage level of power domain D1.

Data retention circuit 100 includes a selection circuit 110, a master latch 120, a slave latch 130, and a level shift circuit 150 in power domain D1, and a retention latch 140 in power domain D2. Selection circuit 110 includes an input 111 configured to receive a data bit D, an input 113 configured to receive a data bit SI, an input 115 configured to receive a signal SE, and an output 112 coupled to an input 121 of master latch 120. Master latch 120 includes an output 123 coupled to an input 131 of slave latch 130.

Slave latch 130 includes an input 133 configured to receive one or more control signals, e.g., a signal RESTORE, an output 132 configured to output data bit Q, and an output 134 coupled to an input 141 of retention latch 140. Retention latch 140 includes an input 143 configured to receive one or more control signals, e.g., a signal S, and an output 142 coupled to an input 151 of level shift circuit 150. Level shift circuit 150 includes an output 152 coupled to an input 135 of slave latch 130. In some embodiments, master latch 120 includes an output 123 (not shown) coupled to input 141 of retention latch 140, and slave latch 130 does not include input 131.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

The data bits and signals discussed with respect to data retention circuit 100 are configured to have one or more voltage levels corresponding to logical states. A high logical state corresponds to a voltage level at or above a first predetermined threshold, and a low logical state corresponds to a voltage level at or below a second predetermined threshold.

In power domain D1, the first predetermined threshold corresponds to a voltage level at or near the first power supply voltage level, and, in power domain D2, the first predetermined threshold corresponds to a voltage level at or near the second power supply voltage level. The second predetermined threshold corresponds to a voltage level at or near the reference voltage level in power domains D1 and D2.

A latch circuit, e.g., master latch 120, slave latch 130, or retention latch 140, is an electronic circuit that includes one or more cross-coupled, inverting logic devices and is thereby configured to maintain one of two logical states representative of two possible logical states of a received data bit or complementary pair of data bits.

Selection circuit 110 is an electronic circuit configured to output a data bit B1 at output 112 responsive to one of data bits D or SI received at respective input 111 or 113 and selected responsive to signal SE received at input 115. In various embodiments, selection circuit 110 is configured to output data bit B1 either as selected data bit D or SI or as selected and inverted data bit D or SI.

Selection circuit 110 is thereby configured to pass data bit B1 representative of selected data bit D or SI to master latch 120. In some embodiments, selection circuit 110 includes a multiplexer. In some embodiments, data retention circuit 100 does not include selection circuit 110, and instead includes a buffer or inverter (not shown) configured to pass data bit B1 representative of data bit D or SI to master latch 120. In some embodiments, data retention circuit 100 does not include selection circuit 110, and master latch 120 is configured to receive data bit B1 at input 121 from a circuit (not shown) other than data retention circuit 100.

Master latch 120 is a latch circuit configured to receive data bit B1 at input 121, and output a data bit B2 at output 122 based on received data bit B1 and selectively latched responsive to one or more clock signals (not shown in FIG. 1). In various embodiments, master latch 120 is configured to output data bit B2 either as latched data bit B1 or as latched inverted data bit B1. Master latch 120 is thereby configured to pass latched data bit B2 representative of data bit B1 to slave latch 130.

Slave latch 130 is a latch circuit configured to receive latched data bit B2 at input 131, a data bit B5 from level shift circuit 150 at input 135, and signal RESTORE at input 133. Output 134 of slave latch 130 is configured to output a data bit B3 based on latched data bit B2, and output 132 is configured to output data bit Q based on one of latched data bits B2 or B5, responsive to signal RESTORE, and latched responsive to one or more clock signals (not shown in FIG. 1).

In various embodiments, slave latch 130 is configured to output data bit B3 as latched data bit B2, inverted latched data bit B2, or a complementary bit pair based on latched data bit B2. Slave latch 130 is thereby configured to pass data bit B3 to retention latch 140 representative of data bit B2. In some embodiments, slave latch 130 is not configured to receive data bit B2 or output data bit B3, and master latch 120 is configured to pass data bit B2 to retention latch 140 as data bit B3.

Slave latch 130 is configured to, in operation, respond to signal RESTORE having one of the high or low logical states by outputting data bit Q based on data bit B2, and respond to signal RESTORE having the other of the high or low logical states by outputting data bit Q based on data bit B5. In various embodiments, slave latch 130 is configured to output data bit Q as a latched one of data bit B2 or B5, a latched one of inverted data bit B2 or B5, or a complementary bit pair based on a latched one of data bit B2 or B5. Slave latch 130 is thereby configured to output latched data bit Q from data retention circuit 100 representative of one of data bits B2 or B5 and based on signal RESTORE.

Retention latch 140 is a latch circuit configured to receive data bit B3 from slave latch 130 or master latch 120 at input 141, receive signal S at input 143, and output data bit B4 at output 142 based on data bit B3 and latched responsive to signal S and one or more clock signals (not shown in FIG. 1). In various embodiments, retention latch 140 is configured to output data bit B4 as latched or unlatched data bit B3, latched or unlatched inverted data bit B3, a latched or unlatched predetermined one of a complementary bit pair B3, or a complementary bit pair based on latched or unlatched data bit B3.

By being included in power domain D1, slave latch 130 is configured to output data bit B3 having one or a combination of the high logical state corresponding to the first power supply voltage level or the low logical state corresponding to the reference voltage level. By being included in power domain D2, retention latch 140 is configured to operate using data bits and signals having high and low logical states corresponding to the respective second power supply voltage level and reference voltage level. Accordingly, retention latch 140 includes one or more level shifters (not shown in FIG. 1) configured to shift the high logical state of data bit B3 from the first power supply voltage level to the second power supply voltage level.

Retention latch 140 is configured to, in operation, respond to signal S having one of the high or low logical states by latching data bit B4 and outputting data bit B4 as latched data bit B4, and respond to signal S having the other of the high or low logical states by outputting data bit B4 as unlatched data bit B4. Retention latch 140 is thereby configured to pass latched or unlatched data bit B4 to level shift circuit 150 representative of data bit B3 and based on signal S.

Level shift circuit 150 is an electronic circuit configured to receive data bit B4 from retention latch 140 at input 151, and output data bit B5 at output 152 based on data bit B4. In various embodiments, level shift circuit 150 is configured to output data bit B5 as data bit B4, inverted data bit B4, or a predetermined one of a complementary bit pair B4.

By being included in power domain D2, retention latch 140 is configured to output data bit B4 having one or a combination of the high logical state corresponding to the second power supply voltage level or the low logical state corresponding to the reference voltage level. By being included in power domain D1, level shift circuit 150 is configured to operate using data bits and signals having high and low logical states corresponding to the respective first power supply voltage level and reference voltage level.

Accordingly, level shift circuit 150 includes one or more level shifters (not shown in FIG. 1) configured to shift the high logical state of data bit B4 from the second power supply voltage level to the first power supply voltage level. Level shift circuit 150 is thereby configured to pass data bit B5 to slave latch 130 representative of data bit B4.

In some embodiments, the first power supply voltage level is higher than the second power supply voltage level, retention latch 140 is configured to downshift the high logical state of data bit B3, and level shift circuit 150 is configured to upshift the high logical state of data bit B4. In some embodiments, the first power supply voltage level is lower than the second power supply voltage level, retention latch 140 is configured to upshift the high logical state of data bit B3, and level shift circuit 150 is configured to downshift the high logical state of data bit B4. In some embodiments, the first power supply voltage level is equal to the second power supply voltage level, retention latch 140 is configured to maintain the high logical state of data bit B3, and level shift circuit 150 is configured to maintain the high logical state of data bit B4.

Data retention circuit 100 is thereby configured to receive data bits D and SI and signal SE during a period in which both power domains D1 and D2 are operating in the power on mode. Selection circuit 110 is configured to pass data bit B1 to master latch 120 representative of data bit D or SI and based on signal SE, master latch 120 is configured to pass latched data bit B2 to slave latch 130 representative of data bit B1, slave latch 130 is configured to pass data bit B3 to retention latch 140 representative of latched data bit B2, retention latch 140 is configured to pass level shifted data bit B4 to level shift circuit 150 representative of data bit B3, level shift circuit 150 is configured to pass level shifted data bit B5 to slave latch 130 representative of data bit B4, and slave latch 130 is configured to output data bit Q representative of either data bit B2 received from master latch 120 or data bit B5 received from level shift circuit 150.

In operation, based on a first logical state of a control signal, e.g., signal RESTORE, slave latch 130 outputs latched data bit Q representing latched data bit B2. Because data bit B2 represents data bit B1, and data bit B1 represents the selected one of received data bit D or SI, the logical state of data bit Q represents the logical state of selected data bit D or SI.

Based on a first logical state of a control signal, e.g., signal S, retention latch 140 passes level shifted and unlatched data bit B4 to level shift circuit 150 representative of data bit B3, and level shift circuit 150 passes level shifted data bit B5 to slave latch 130 representative of data bit B4. In response to a control signal transition, e.g., a transition from the first logical state of signal S to a second logical state of signal S, retention latch 140 latches level shifted data bit B4 and outputs level shifted and latched data bit B4 to level shift circuit 150. Because data bit B4 represents data bit B3, and data bit B3 represents data bit B2, the logical state of level shifted and latched data bit B4 represents the logical state of the selected one of received data bit D or SI.

In response to power domain D1 transitioning from the power on mode to the power down mode, selection circuit 110, master latch 120, slave latch 130, and level shift circuit 150 become non-operational, and the logical states of data bits D, SI, B1, B2, B3, B5, and Q are not maintained. Because power domain D2 continues to be in the power on mode, retention latch 140 continues to output level shifted and latched data bit B4 to level shift circuit 150.

In response to power domain D1 returning to the power on mode from the power down mode, selection circuit 110, master latch 120, slave latch 130, and level shift circuit 150 become operational, with the logical states of data bits D, SI, B1, B2, B3, and Q being uncontrolled. Because power domain D2 continues to be in the power on mode, retention latch 140 continues to output level shifted and latched data bit B4 to level shift circuit 150, and level shift circuit 150 resumes passing level shifted data bit B5 to slave latch 130 based on level shifted and latched data bit B4.

Because data bit B5 is based on data bit B4, and the logical state of data bit B4 represents the logical state of data bit D or SI received and selected prior to the transition of power domain D1 to the power down mode, the logical state of data bit B5 represents the logical state of data bit D or SI received and selected prior to the transition of power domain D1 to the power down mode.

In response to a control signal transition, e.g., a transition from the first logical state of signal RESTORE to a second logical state of signal RESTORE, slave latch 130 outputs latched data bit Q based on level shifted data bit B5. Because latched data bit Q is based on data bit B5, the logical state of data bit Q represents the logical state of data bit D or SI received and selected prior to the transition of power domain D1 to the power down mode. The logical state of data bit Q after power domain D1 returns to the power on mode thereby matches the logical state of data bit Q prior to the transition of power domain D1 to the power down mode.

Data retention circuit 100 is thereby capable of retaining logical states of data bit Q during periods when power domain D1 is in the power down mode by operating retention latch 140 in power domain D2 having the second power supply voltage level independent of the first power supply voltage level. By being capable of using the second power supply voltage level different from the first power supply voltage level, data retention circuit 100 has increased flexibility with respect to both circuit applications and placement within an IC layout compared to approaches that do not use a second power supply voltage level independent of a first power supply voltage level.

By being capable of using the second power supply voltage level lower than the first power supply voltage level, data retention circuit 100 is further capable of retaining data using less power and with lower leakage current than approaches in which a second power supply voltage level used to retain data is equal to the first power supply voltage level.

Figure 2:
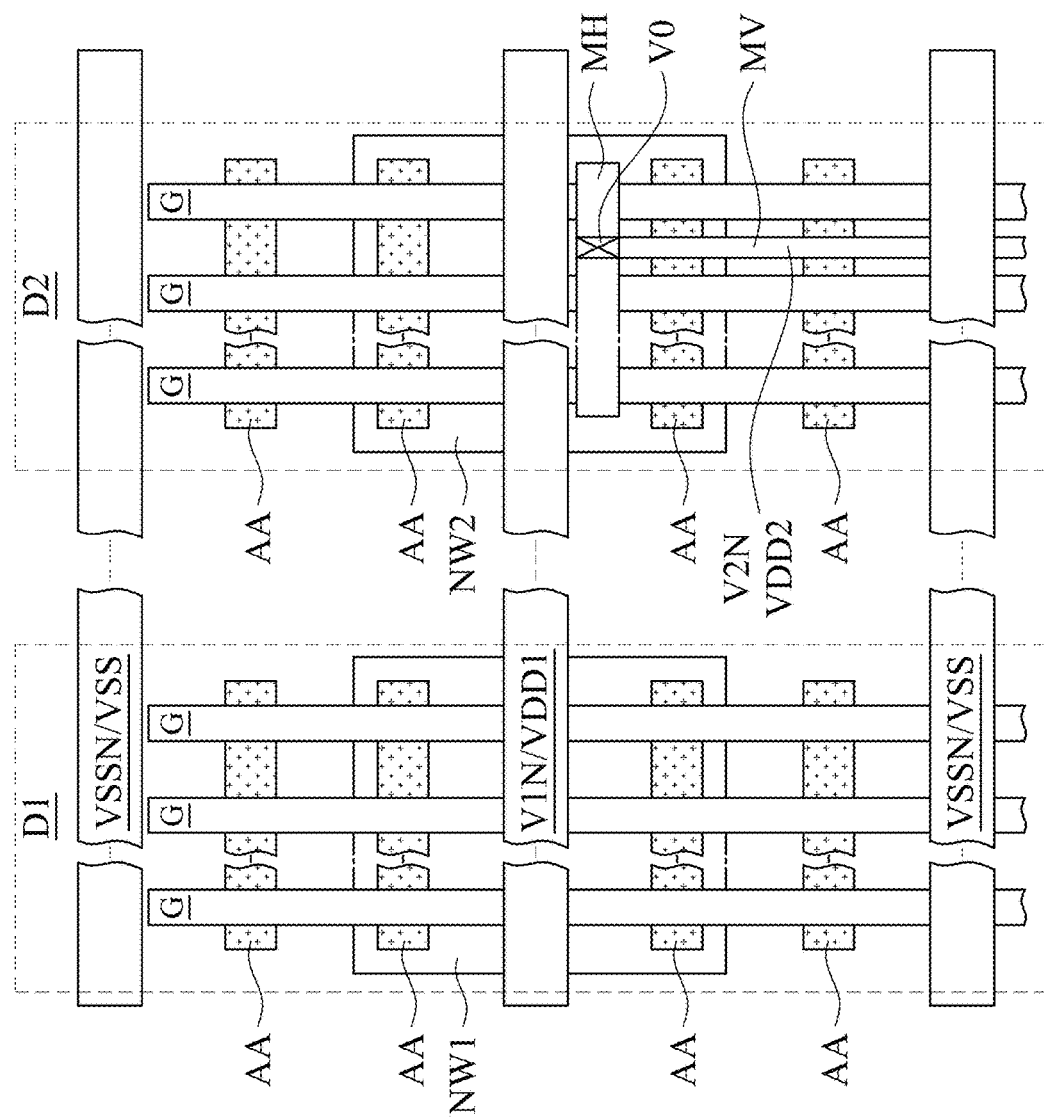
FIG. 2 is a diagram of a data retention integrated circuit, in accordance with some embodiments.

FIG. 2 is a diagram of data retention IC 200, in accordance with some embodiments. Data retention IC 200 is a non-limiting example of data retention circuit 100 discussed above with respect to FIG. 1.

FIG. 2 depicts a plan view of data retention IC 200 including power domains D1 and D2 discussed above with respect to FIG. 1. Data retention IC 200 also includes power nodes V1N and V2N, reference nodes VSSN, gate structures G, active areas AA, also referred to as oxide diffusions or definitions (OD), and n-wells NW1 and NW2.

The numbers of power nodes V1N and V2N, reference nodes VSSN, gate structures G, active areas AA, and n-wells NW1 and NW2 depicted in FIG. 2 is for illustration only. In various embodiments, data retention IC 200 incudes greater or fewer numbers of one or more of power nodes V1N or V2N, reference nodes VSSN, gate structures G, active areas AA, or n-wells NW1 or NW2.

Power node V1N is one or more conductive elements configured to connect a power source (not shown) having first power supply voltage level VDD1 to circuit components in power domain D1. In the embodiment depicted in FIG. 2, power node V1N extends across power domains D1 and D2. In some embodiments, power node V1N does not extend into power domain D2.

FIG. 2 depicts a single metal segment of power node V1N. In various embodiments, power node V1N includes one or more metal segments in addition to a single metal segment that are not depicted in FIG. 2 for the purpose of clarity. In some embodiments, power node V1N includes one or more segments of a metal three layer of the IC.

Each reference node VSSN is one or more conductive elements configured to connect a ground or other voltage reference having reference voltage level VSS to circuit components in each of power domains D1 and D2. In the embodiment depicted in FIG. 2, each reference node VSSN extends across power domains D1 and D2. In some embodiments, a given reference node VSSN does not extend into one of power domains D1 or D2.

FIG. 2 depicts a single metal segment of each reference node VSSN. In various embodiments, one or both of reference nodes VSSN includes one or more metal segments in addition to a single metal segment that are not depicted in FIG. 2 for the purpose of clarity. In some embodiments, one or both of reference nodes VSSN includes a segment of the metal three layer of the IC.

Power node V2N is one or more conductive elements configured to connect a power source (not shown) having second power supply voltage level VDD2 to circuit components in power domain D2. In the embodiment depicted in FIG. 2, power node V2N includes a metal segment MH and a metal segment MV electrically connected to metal segment MH by a via VO.

In various embodiments, metal segment MH is a segment of one of a metal zero or a metal one layer of the IC, metal segment MV is a segment of the other of the metal zero or metal one layer of the IC, and via VO is a metal zero via of the IC between the metal zero and metal one layers. In various embodiments, data retention IC 200 incudes one or more of metal segments MH and MV and via VO otherwise configured to carry second power supply voltage VDD2 in power domain D2.

In various embodiments, data retention IC 200 does not include one or more of metal segments MH and MV and via VO and/or incudes one or more metal segments other than metal segments MH and MV and via VO configured to carry second power supply voltage VDD2 in power domain D2.

Each of power domains D1 and D2 includes a plurality of gate structures G overlying a plurality of active areas AA, thereby defining a plurality of transistors (not labeled) included in data retention IC 200. In the embodiment depicted in FIG. 2, an entirety of each of active areas AA is included in one of power domains D1 or D2. In various embodiments, one or more of active areas AA extends across both of power domains D1 and D2.

In addition to the features depicted in FIG. 2, data retention IC 200 includes IC elements, e.g., one or more contacts, vias, isolation structures, wells, conductive elements, or the like, that are not shown for the purpose of clarity, and are configured along with the features depicted in FIG. 2 to constitute the components of data retention circuit 100 discussed above with respect to FIG. 1.

In the embodiment depicted in FIG. 2, each of selection circuit 110, master latch 120, slave latch 130, and level shift circuit 150 includes portions of power node V1N, reference node VSSN, gate structures G, active areas AA, n-well NW1, and other features in power domain D1, and retention latch 140 includes portions of power node V2N, reference node VSSN, gate structures G, active areas AA, n-well NW2, and other features in power domain D2.

By being configured to use power supply voltage level VDD2 different from power supply voltage level VDD2, data retention IC 200 has the circuit application and IC layout flexibility benefits discussed above with respect to data retention circuit 100.

Further, at least one active area AA in power domain D1 is positioned in n-well NW1, and at least one active area AA in power domain D2 is positioned in n-well NW2. Because leakage currents between transistors corresponding to separate n-wells NW1 and NW2 are typically lower than leakage currents between transistors sharing a given n-well NW1 or NW2, data retention IC 200 is capable of having lower leakage currents than approaches in which a retention latch shares a well with a master or slave latch.

Figure 3:
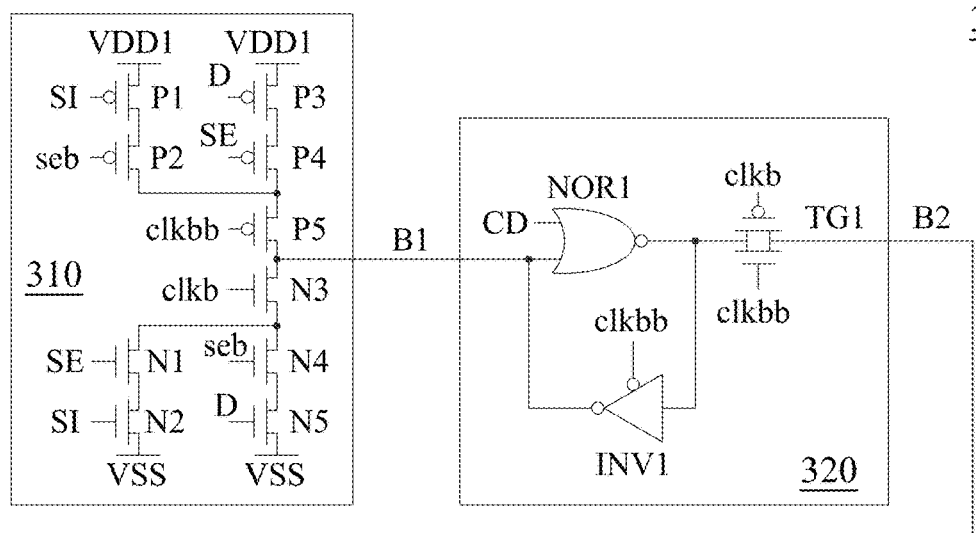
FIG. 3 is a diagram of a data retention circuit, in accordance with some embodiments.
Figure 3:
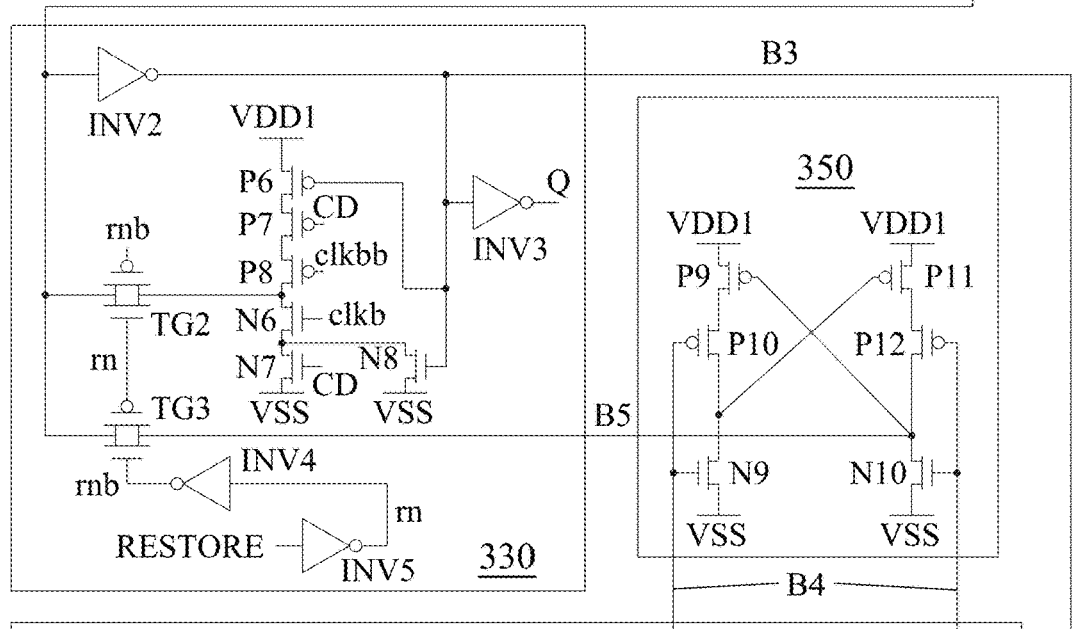
Figure 3:
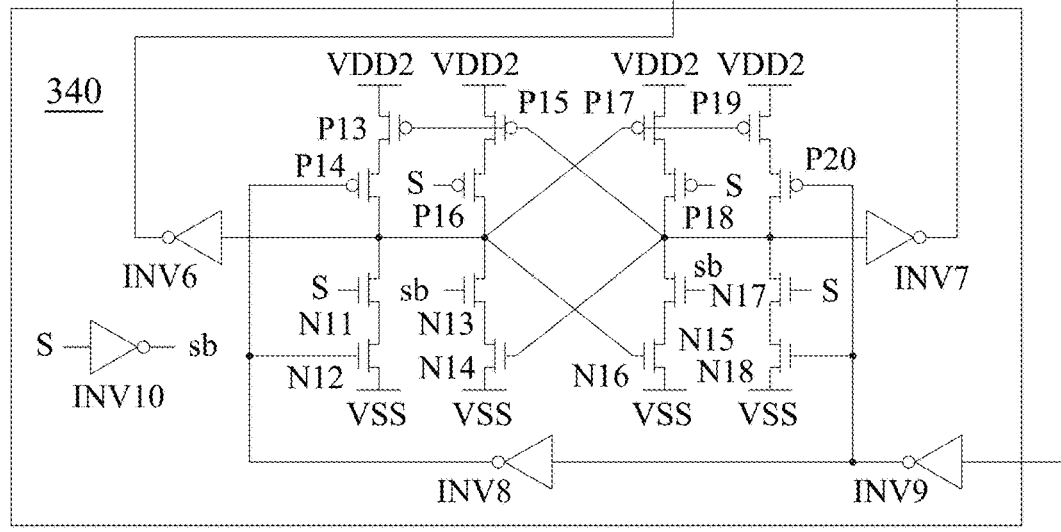

FIG. 3 is a diagram of a data retention circuit 300, in accordance with some embodiments. Data retention circuit 300 is usable as data retention circuit 100 discussed above with respect to FIG. 1.

Data retention circuit 300 includes a selection circuit 310, a master latch 320, a slave latch 330, a retention latch 340, and a level shift circuit 350, each usable as part or all of the corresponding selection circuit 110, master latch 120, slave latch 130, retention latch 140, or level shift circuit 150 discussed above with respect to data retention circuit 100 and FIG. 1.

Selection circuit 310 includes p-type transistors P1-P5, n-type transistors N1-N5, power nodes configured to carry first power supply voltage level VDD1, and reference nodes configured to carry reference voltage level VSS.

Transistors P1, P2, P5, N3, N1, and N2 are arranged in series and coupled between first power supply voltage level VDD1 and reference voltage level VSS, transistors P3 and P4 are arranged in series and coupled in parallel with transistors P1 and P2, and transistors N4 and N5 are arranged in series and coupled in parallel with transistors N1 and N2.

Transistor P1 includes a gate configured to receive data bit SI, transistor P2 includes a gate configured to receive a signal seb, the complement of signal SE, transistor P3 includes a gate configured to receive data bit D, transistor P4 includes a gate configured to receive signal SE, transistor N1 includes a gate configured to receive signal SE, transistor N2 includes a gate configured to receive data bit SI, transistor N4 includes a gate configured to receive signal seb, and transistor N5 includes a gate configured to receive data bit D.

Transistor N3 includes a gate configured to receive a clock signal clkb, and transistor P5 includes a gate configured to receive a clock signal clkbb, the complement of clock signal clkb. Source terminals of transistors N3 and P5 are coupled to each other and configured to output data bit B1.

As depicted in FIG. 3 and discussed above, selection circuit 310 is configured to respond to a high logical state of signal SE by coupling data bit B1 to first power supply voltage level VDD1 or reference voltage level VSS responsive to a logical state of data bit SI, and respond to a low logical state of signal SE by coupling data bit B1 to first power supply voltage level VDD1 or reference voltage level VSS responsive to a logical state of data bit D. Selection circuit 310 is configured to further couple data bit B1 to first power supply voltage level VDD1 and reference voltage level VSS responsive to complementary clock signals clkb and clkbb.

Selection circuit 310 is thereby configured to output data bit B1 representative of one of received data bits SI or D and responsive to signal SE.

Master latch 320 includes a NOR gate NOR1, an inverter INV1 cross-coupled to NOR gate NOR1, and a transmission gate TG1 coupled to an output of NOR gate NOR1 and an input of inverter INV1. Inputs of NOR gate NOR1 are configured to receive data bit B1 from selection circuit 310 and a signal CD, inverter INV1 is configured to receive clock signal clkbb, and transmission gate TG1 includes gates configured to receive clock signals clkb and clkbb.

As depicted in FIG. 3 and discussed above, master latch 320 is configured to respond to signal CD having the low logical state by inverting data bit B1, latching inverted data bit B1 using inverter INV1 responsive to clock signal clkbb, and outputting latched inverted data bit B1 as data bit B2 using transmission gate TG1 responsive to clock signals clkb and clkbb. Master latch 320 is configured to respond to signal CD having the high logical state by outputting data bit B2 having the low logical state using transmission gate TG1 responsive to clock signals clkb and clkbb, thereby operating to reset data bit B2 responsive to signal CD.

Master latch 320 is thereby configured to output data bit B2 representative of received data bit B1 and responsive to signal CD.

Slave latch 330 includes p-type transistors P6-P8, n-type transistors N6-N8, inverters INV2-INV5, transmission gates TG2 and TG3, a power node configured to carry first power supply voltage level VDD1, and reference nodes configured to carry reference voltage level VSS.

Transistors P6-P8, N6, and N7 are arranged in series and coupled between first power supply voltage level VDD1 and reference voltage level VSS, and transistor N8 is coupled in parallel with transistor N7. Transistor P6 includes a gate coupled to a gate of transistor N8, an output of inverter INV2, and an input of inverter INV3. Transistor P7 includes a gate configured to receive signal CD, transistor P8 includes a gate configured to receive clock signal clkbb, transistor N6 includes a gate configured to receive clock signal clkb, and transistor N7 includes a gate configured to receive signal CD. Source terminals of transistors N6 and P8 are coupled to each other and to transmission gate TG2.

An input of inverter INV2 is coupled to transmission gates TG2 and TG3 and configured to receive data bit B2 from master latch 320, and the output of inverter INV2 is configured to output inverted data bit B2 as data bit B3. Inverter INV3 is configured to output inverted data bit B3 as data bit Q.

Transistors P6-P8 and N6-N8 are thereby configured as an inverter cross-coupled to inverter INV2 through transmission gate TG2 and responsive to signal CD and clock signals clkb and clkbb.

An input of inverter INV5 is configured to receive signal RESTORE, and an output of inverter INV5 is coupled to an input of inverter INV4 and a gate of each of transmission gates TG2 and TG3. An output of inverter INV4 is coupled to another gate of each of transmission gates TG2 and TG3.

As depicted in FIG. 3 and discussed above, slave latch 330 is configured to respond to signal RESTORE having the low logical state by generating a signal rn having the high logical state and a signal rnb having the low logical state, thereby turning on transmission gate TG2, turning off transmission gate TG3, and causing slave latch 330 to output latched data bit Q based on data bit B3 inverted from data bit B2. In some embodiments, slave latch 330 does not include one or both of inverters INV4 or INV5, and data retention circuit 300 is otherwise configured to receive complementary signal pair rn and rnb.

Slave latch 330 is configured to respond to signal RESTORE having the high logical state by generating signal rn having the low logical state and signal rnb having the high logical state, thereby turning on transmission gate TG3, turning off transmission gate TG2, and causing slave latch 330 to output latched data bit Q based on data bit B5 received from level shift circuit 350.

Slave latch 330 is thereby configured to output latched data bit Q from data retention circuit 300 representative of one of data bits B2 or B5 and responsive to signals RESTORE and CD.

Retention latch 340 includes p-type transistors P13-P20, n-type transistors N11-N18, inverters INV6-INV10, power nodes configured to carry second power supply voltage level VDD2, and reference nodes configured to carry reference voltage level VSS.

Transistors P13, P14, N11, and N12 are arranged in series and coupled between second power supply voltage level VDD2 and reference voltage level VSS, transistors P15, P16, N13, and N14 are arranged in series and coupled between second power supply voltage level VDD2 and reference voltage level VSS, transistors P17, P18, N15, and N16 are arranged in series and coupled between second power supply voltage level VDD2 and reference voltage level VSS, and transistors P19, P20, N17, and N18 are arranged in series and coupled between second power supply voltage level VDD2 and reference voltage level VSS.

Each of transistors N11, P16, P18, and N17 includes a gate configured to receive signal S, and each of transistors N13 and N15 includes a gate configured to receive signal sb, the complement of signal S. Transistor P14 includes a gate coupled to a gate of transistor N12 and an output of inverter INV8. Transistor P20 includes a gate coupled to a gate of transistor N18, an input of inverter INV8, and an output of inverter INV9. Inverter INV9 includes an input configured to receive data bit B3, and inverter INV10 includes an input configured to receive signal S and an output coupled to the gates of transistors N13 and N15.

Source terminals of transistors P14, N11, P16, and N13 are coupled to each other, to gates of transistors P17, P19, and N16, and to an input of inverter INV6. Source terminals of transistors P18, N15, P20, and N17 are coupled to each other, to gates of transistors P13, P15, and N14, and to an input of inverter INV7. Inverters INV6 and INV7 include outputs configured to output data bit B4 as a complementary bit pair.

Transistors P13, P14, N12, P19, P20, and N18 are thereby configured as a level shifter responsive to the outputs of inverters INV8 and INV9, and transistors P15, P17, N14, and N16 are thereby configured as a latch combined with the level shifter. Transistors N11, P16, N13, P18, N15, and N17 are thereby configured to control the combined level shifter and latch responsive to complementary signals S and sb.

As depicted in FIG. 3 and discussed above, retention latch 340 is configured to respond to signal S having the high logical state by generating signal sb having the low logical state, thereby turning on transistors N11 and N17 to enable the level shifter and turning off transistors P16, N13, P18, N15 to disable the latch.

Retention latch 340 is configured to respond to signal S transitioning to the low logical state by turning off transistors N11 and N17 to decouple transistors N12 and N18 of the level shifter from the respective outputs of inverters INV8 and INV9, and turning on transistors P16, N13, P18, N15 to latch and output the complementary bit pair of data bit B4 based on received data bit B3.

Retention latch 340 is thereby configured to output latched or unlatched data bit B4 representative of data bit B3 and responsive to signal S.

Level shift circuit 350 includes p-type transistors P9-P12, n-type transistors N9 and N10, power nodes configured to carry first power supply voltage level VDD1, and reference nodes configured to carry reference voltage level VSS.

Transistors P9, P10, and N9 are arranged in series and coupled between first power supply voltage level VDD1 and reference voltage level VSS, and transistors P11, P12, and N10 are arranged in series and coupled between first power supply voltage level VDD1 and reference voltage level VSS.

Transistor P10 includes a gate coupled to a gate of transistor N9 and configured to receive one of the complementary bit pair of data bit B4. Transistor P12 includes a gate coupled to a gate of transistor N10 and configured to receive the other of the complementary bit pair of data bit B4. Source terminals of transistors P10 and N9 are coupled to each other and to a gate of transistor P11, and source terminals of transistors P12 and N10 are coupled to each other and to a gate of transistor P9.

Transistors P9-P12, N9, and N10 are thereby configured as a level shifter responsive to the complementary bit pair of data bit B4, and level shift circuit 350 is thereby configured to output data bit B5 based on data bit B4.

By the configuration depicted in FIG. 3 and discussed above, data retention circuit 300 has the capabilities discussed above with respect to data retention circuits 100 and 200 and FIGS. 1 and 2, and is further responsive to signal CD. Data retention circuit 300 is thereby capable of realizing the benefits discussed above with respect to data retention circuits 100 and 200.

Figure 4:
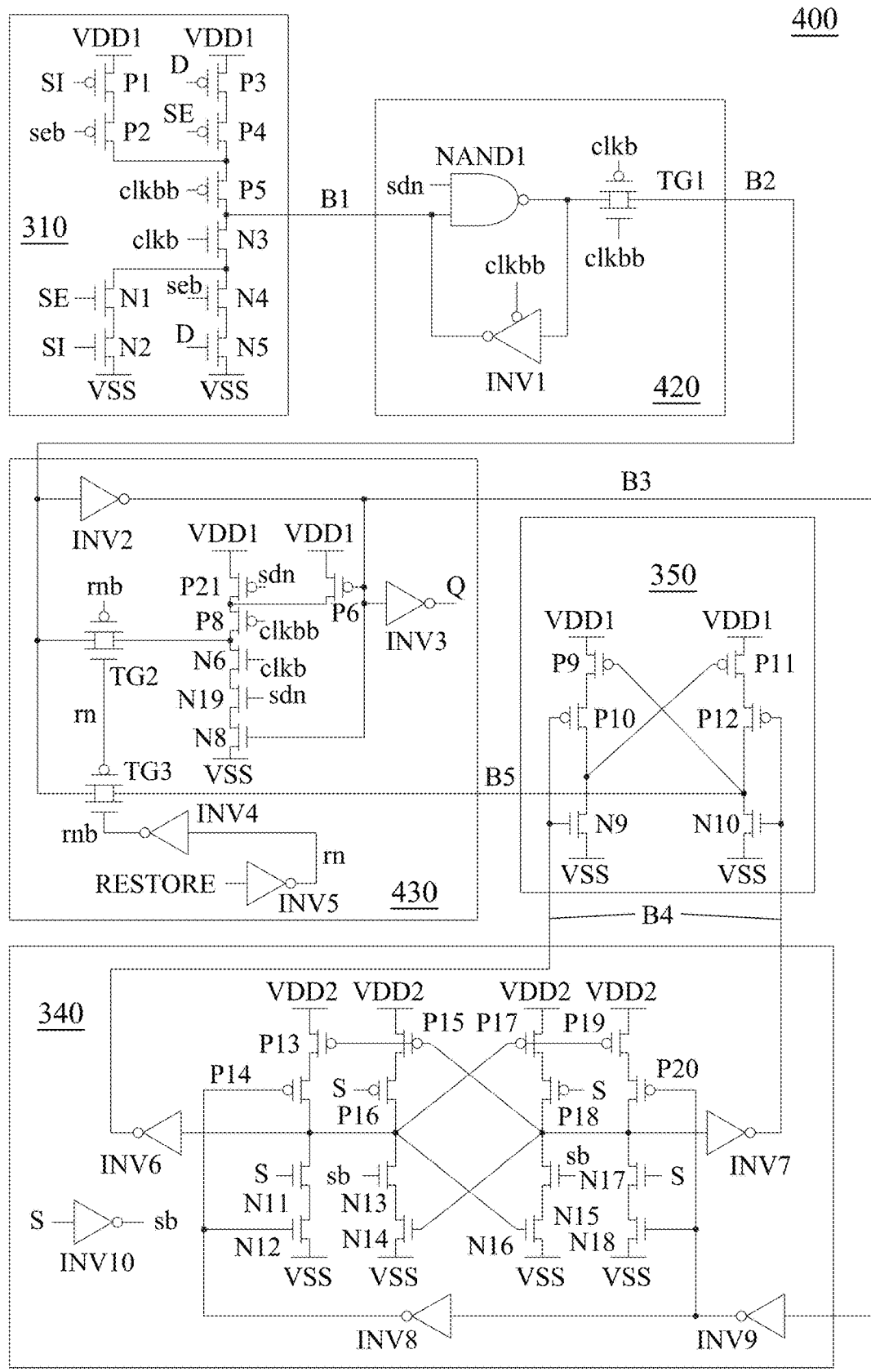
FIG. 4 is a diagram of a data retention circuit, in accordance with some embodiments.

FIG. 4 is a diagram of a data retention circuit 400, in accordance with some embodiments. Data retention circuit 400 is usable as data retention circuit 100 discussed above with respect to FIG. 1.

Data retention circuit 400 includes selection circuit 310, retention latch 340, and level shift circuit 350, each discussed above with respect to data retention circuit 300 and FIG. 3. Data retention circuit 400 also includes a master latch 420, usable as part or all of master latch 120, and a slave latch 430, usable as part or all of slave latch 130, each discussed above with respect to data retention circuit 100 and FIG. 1.

Master latch 420 includes inverter INV1 and transmission gate TG1 configured as discussed above with respect to master latch 320 and FIG. 3. Instead of being coupled to the input and output of NOR gate NOR1, inverter INV1 and transmission gate TG1 are coupled to a respective input and output of a NAND gate NAND1. NAND gate NAND1 includes an input configured to receive a signal sdn.

As depicted in FIG. 4 and discussed above, master latch 420 is configured to respond to signal sdn having the high logical state by inverting data bit B1, latching inverted data bit B1 using inverter INV1 responsive to clock signal clkbb, and outputting latched inverted data bit B1 as data bit B2 using transmission gate TG1 responsive to clock signals clkb and clkbb. Master latch 420 is configured to respond to signal sdn having the low logical state by outputting data bit B2 having the high logical state using transmission gate TG1 responsive to clock signals clkb and clkbb, thereby operating to set data bit B2 responsive to signal sdn.

Master latch 420 is thereby configured to output data bit B2 representative of received data bit B1 and responsive to signal sdn.

Slave latch 430 includes transistors P6, P8, N6, and N8, inverters INV2-INV5, and transmission gates TG2 and TG3 configured as discussed above with respect to slave latch 330 and FIG. 3. Instead of including transistors P7 and N7, slave latch 430 includes a p-type transistor P21 and an n-type transistor N19.

Transistor P21 is coupled in parallel with P6 and includes a gate configured to receive signal sdn. Transistor N19 is arranged in series with transistors P6, P8, N6, and N8, coupled between first power supply voltage level VDD1 and reference voltage level VSS, and includes a gate configured to receive signal sdn.

Transistors P6, P8, P21, N6, N8, and N19 are thereby configured as an inverter cross-coupled to inverter INV2 through transmission gate TG2 and responsive to signal sdn and clock signals clkb and clkbb, and slave latch 430 is thereby configured to output latched data bit Q from data retention circuit 400 representative of one of data bits B2 or B5 and responsive to signals RESTORE and sdn.

By the configuration depicted in FIG. 4 and discussed above, data retention circuit 400 has the capabilities discussed above with respect to data retention circuits 100 and 200 and FIGS. 1 and 2, and is further responsive to signal sdn. Data retention circuit 400 is thereby capable of realizing the benefits discussed above with respect to data retention circuits 100 and 200.

Figure 5:
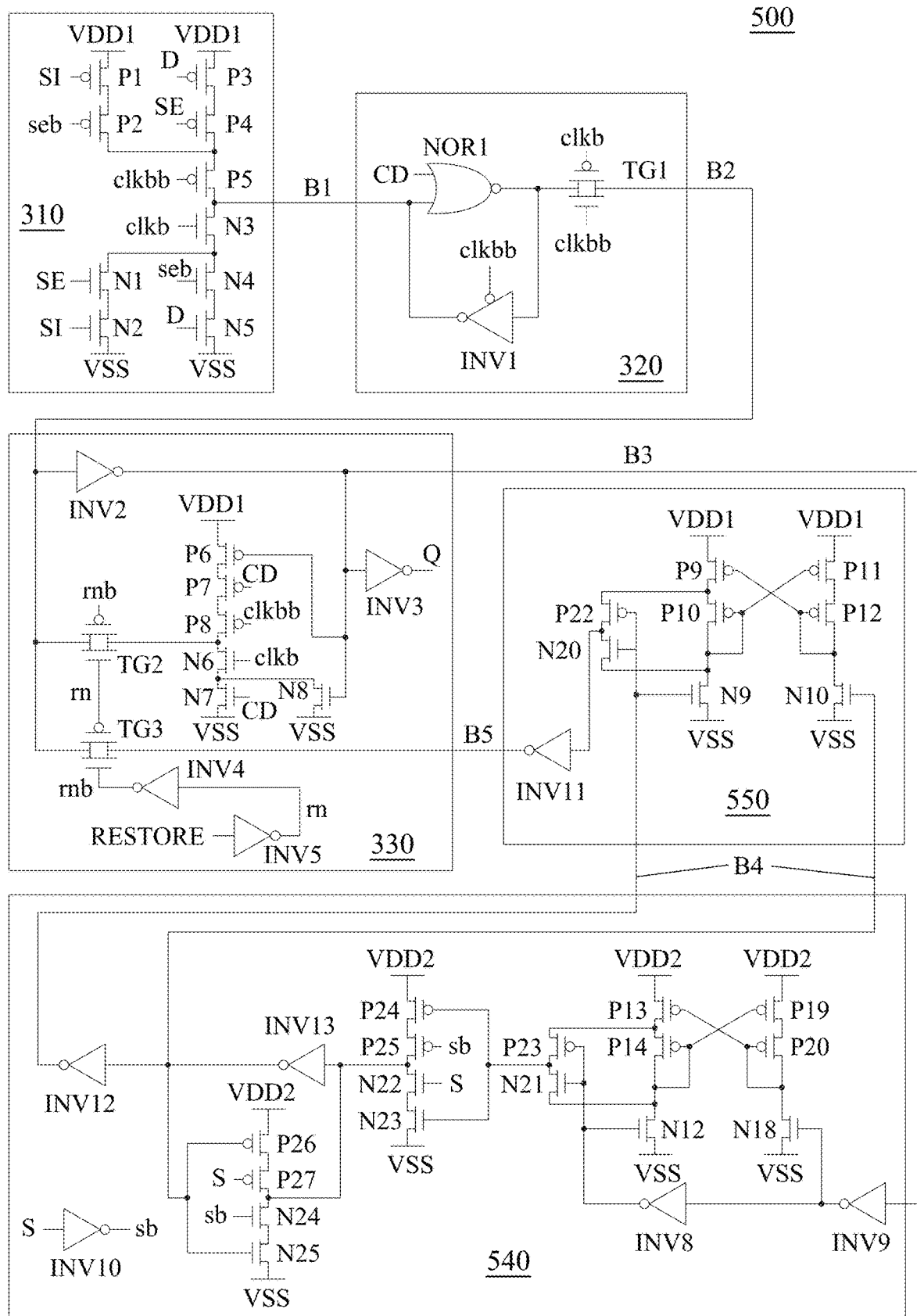
FIG. 5 is a diagram of a data retention circuit, in accordance with some embodiments.

FIG. 5 is a diagram of a data retention circuit 500, in accordance with some embodiments. Data retention circuit 500 is usable as data retention circuit 100 discussed above with respect to FIG. 1.

Data retention circuit 500 includes selection circuit 310, master latch 320, and slave latch 330, each discussed above with respect to data retention circuit 300 and FIG. 3. Data retention circuit 500 also includes a retention latch 540, usable as part or all of retention latch 340, and a level shift circuit 550, usable as part or all of level shift circuit 150, each discussed above with respect to data retention circuit 100 and FIG. 1.

Retention latch 540 includes transistors P13, P14, N12, P19, P20, and N18, and inverters INV8-INV10, each discussed above with respect to retention latch 340 and FIG. 3. Retention latch 540 also includes p-type transistors P23-P27, n-type transistors N21-N25, and inverters INV12 and INV13.

Transistors P13, P14, N12, P19, P20, and N18 and inverters INV8 and INV9 are configured as a level shifter similar to that of retention latch 340 discussed above with respect to FIG. 3, except that the gate and source terminal of transistor P14 are connected to each other, the gate and source terminal of transistor P20 are connected to each other, and the level shifter does not include transistors N11 and N17 configured to receive signal S.

Transistors P23 and N21 are arranged in series and coupled in parallel with transistor P14, and each of transistors P23 and N21 includes a gate configured to receive the output of inverter INV8.

Transistors P24, P25, N22, and N23 are arranged in series and coupled between second power supply voltage level VDD2 and reference voltage level VSS. Each of transistors P24 and N23 includes a gate coupled to a source terminal of transistor P23 and a source terminal of transistor N21. Transistor P25 includes a gate configured to receive signal sb, and transistor N22 includes a gate configured to receive signal S.

Transistors P26, P27, N24, and N25 are arranged in series and coupled between second power supply voltage level VDD2 and reference voltage level VSS. Each of transistors P26 and N25 includes a gate coupled to an output of inverter INV13 and an input of inverter INV12. A source terminal of transistor P27 is coupled to a source terminal of each of transistors N24, P25, and N21, and to an input of inverter INV13. Transistor P27 includes a gate configured to receive signal S, and transistor N24 includes a gate configured to receive signal sb. Outputs of inverters INV12 and INV13 are configured to output data bit B4 as a complementary bit pair.

Transistors P13, P14, N12, P19, P20, N18, P23, and N21 are thereby configured as a level shifter responsive to the outputs of inverters INV8 and INV9. Compared to the level shifter discussed above with respect to retention latch 340 and FIG. 3, the level shifter of retention latch 540 is capable of operating within a wider range of voltage values of the first and second power supply voltage levels.

Transistors P24, P25, N22, and N23 are thereby configured as an inverter responsive to complementary signals S and sb and arranged in series with the level shifter. Transistors P26, P27, N24, and N25 are thereby configured as an inverter responsive to complementary signals S and sb and cross-coupled to inverter INV13 as a latch, the latch being arranged in series with the inverter and level shifter.

As depicted in FIG. 5 and discussed above, retention latch 540 is configured to respond to signal S having the high logical state by generating signal sb having the low logical state, thereby turning on transistors P25 and N22 to enable the inverter and turning off transistors P27 and N24 to disable the latch.

Retention latch 540 is configured to respond to signal S transitioning to the low logical state by turning off transistors P25 and N22 to disable the inverter, and turning on transistors P27 and N24 to latch and output the complementary bit pair of data bit B4 based on received data bit B3.

Retention latch 540 is thereby configured to output latched or unlatched data bit B4 representative of data bit B3 and responsive to signal S.

Level shift circuit 550 includes transistors P9, P10, N9, P11, P12, and N10, each discussed above with respect to level shift circuit 350 and FIG. 3. Level shift circuit 550 also includes a p-type transistor P22, an n-type transistor N20, and an inverter INV11.

Transistors P9, P10, N9, P11, P12, and N10 are configured as a level shifter similar to that of level shift circuit 350 discussed above with respect to FIG. 3, except that the gate and source terminal of transistor P10 are connected to each other, and the gate and source terminal of transistor P12 are connected to each other.

Transistors P22 and N20 are arranged in series and coupled in parallel with transistor P10, and each of transistors P22 and N20 includes a gate coupled to the gate of transistor N9 and a source terminal coupled to an input of inverter INV11. An output of inverter INV11 is configured to output data bit B5.

Transistors P9-P12, P22, N9, N10, and N20 and inverter INV11 are thereby configured as a level shifter responsive to the complementary bit pair of data bit B4, and level shift circuit 550 is thereby configured to output data bit B5 representative of data bit B4. Compared to level shift circuit 350 discussed above with respect to FIG. 3, level shift circuit 550 is capable of operating within a wider range of voltage values of the first and second power supply voltage levels.

By the configuration depicted in FIG. 5 and discussed above, data retention circuit 500 has the capabilities discussed above with respect to data retention circuits 100 and 200 and FIGS. 1 and 2, and is further capable of operating within a relatively wider range of voltage values of the first and second power supply voltage levels. Data retention circuit 500 is thereby capable of realizing the benefits discussed above with respect to data retention circuits 100 and 200.

Figure 6:
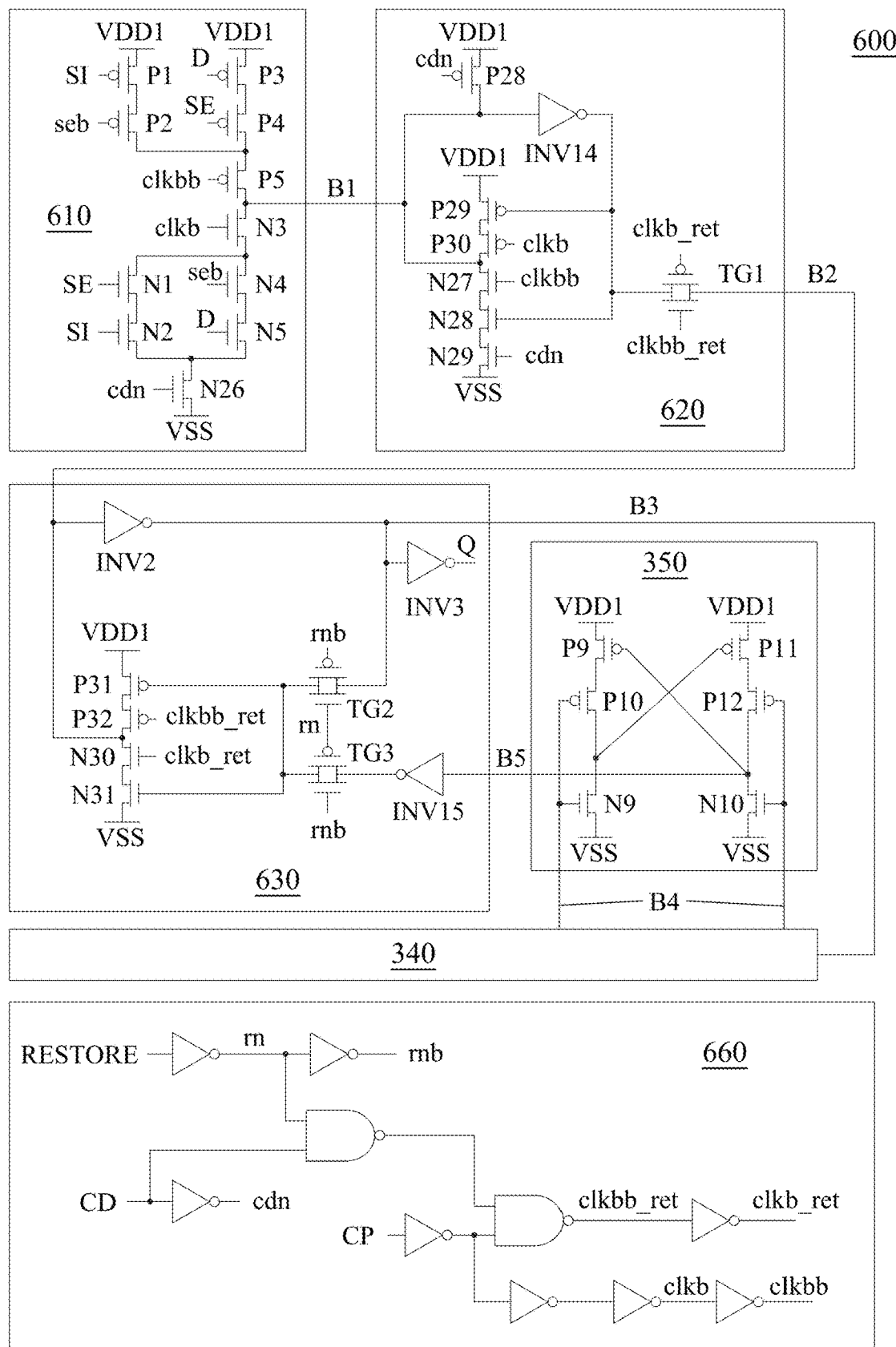
FIG. 6 is a diagram of a data retention circuit, in accordance with some embodiments.

FIG. 6 is a diagram of a data retention circuit 600, in accordance with some embodiments. Data retention circuit 600 is usable as data retention circuit 100 discussed above with respect to FIG. 1.

Data retention circuit 600 includes retention latch 340 and level shift circuit 350 discussed above with respect to data retention circuit 300 and FIG. 3, a selection circuit 610 usable as part or all of selection circuit 110, a master latch 620 usable as part or all of master latch 120, and a slave latch 630 usable as part or all of slave latch 130, each discussed above with respect to data retention circuit 100 and FIG. 1.

Data retention circuit 600 also includes a plurality of logic gates 660 (not individually labeled) configured to receive signals RESTORE and CD, discussed above with respect to data retention circuits 100 and 300 and FIGS. 1 and 3, and a clock signal CP. Plurality of logic gates 660 is configured to output signals rn, rnb, and cdn and clock signals clkb-b_ret, clkb_ret, clkb, and clkbb in accordance with the configuration depicted in FIG. 6.

In some embodiments, one or more logic gates of plurality of logic gates 660 is included in one or more of selection circuit 610, master latch 620, slave latch 630, retention latch 340, or level shift circuit 350. In some embodiments, data retention circuit 600 does not include plurality of logic gates 660 and is otherwise configured to output signals rn, rnb, and cdn and clock signals clkbb_ret, clkb_ret, clkb, and clkbb in accordance with the configuration depicted in FIG. 6.

Selection circuit 610 includes transistors P1-P5 and N1-N5 configured as discussed above with respect to selection circuit 310 and FIG. 3. Selection circuit 610 also includes an n-type transistor N26 coupled between transistors P1-P5 and N1-N5 and reference voltage level VSS.

Transistor N26 includes a gate configured to receive signal cdn, the complement of signal CD. Selection circuit 610 is thereby configured to have the capabilities discussed above with respect to selection circuit 310 and FIG. 3, enabled by signal cdn having the high logical state corresponding to signal CD having the low logical state.

Selection circuit 610 is thereby configured to output data bit B1 representative of one of received data bits SI or D and responsive to signals SE and CD.

Master latch 620 includes transmission gate TG1 configured as discussed above with respect to master latch 320 and FIG. 3. Instead of being configured to receive clock signals clkb and clkbb, transmission gate TG1 is configured to receive clock signals clkbb_ret and clkb_ret.

Master latch 620 also includes p-type transistors P28-P30, n-type transistors N27-N29, and an inverter INV14. Transistors P29, P30, and N27-N29 are arranged in series and coupled between first power supply voltage level VDD1 and reference voltage level VSS. Each of transistors P29 and N28 includes a gate coupled to an output of inverter INV14 and transmission gate TG1. A source terminal of transistor P30 is coupled to a source terminal of each of transistors N27 and P28 and to an input of inverter INV14, configured to receive data bit B1. Transistor P28 is coupled between first power supply voltage level VDD1 and the input of inverter INV14, and includes a gate configured to receive signal cdn.

Transistors P29, P30, and N27-N29 are thereby configured as an inverter cross-coupled to inverter INV14 as a latch, the latch being arranged in series with transmission gate TG1, enabled by signal cdn having the high logical state, and set to the high logical state by signal cdn having the low logical state.

Master latch 620 is thereby configured to have the capabilities discussed above with respect to master latch 320 and FIG. 3, enabled by signal cdn having the high logical state corresponding to signal CD having the low logical state.

Slave latch 630 includes inverters INV2 and INV3 and transmission gates TG2 and TG3 configured as discussed above with respect to slave latch 330 and FIG. 3. Slave latch 630 also includes p-type transistors P31 and P32, n-type transistors N30 and N31, and an inverter INV15, and is configured to receive signals rn and rnb. In some embodiments, slave latch 630 includes inverters INV4 and INV5, discussed above with respect to slave latch 330 and FIG. 3, and is configured to receive signal RESTORE.

Transistors P31, P32, N30, and N31 are arranged in series and coupled between first power supply voltage level VDD1 and reference voltage level VSS. Each of transistors P31 and N31 includes a gate coupled to the output of inverter INV2 through transmission gate TG2 and to an output of inverter INV15 through transmission gate TG3. Transistor P32 includes a gate configured to receive clock signal clkbb_ret, and transistor N30 includes a gate configured to receive clock signal clkb_ret. A source terminal of transistor P32 is coupled to a source terminal of transistor N30 and to the input of inverter INV2, configured to receive data bit B2, and inverter INV15 includes an input configured to receive data bit B5.

Transistors P31 P32, N30, and N31 are thereby configured as an inverter cross-coupled to inverter INV2 through transmission gate TG2 and responsive to clock signals clkbb_ret and clkb_ret, and slave latch 630 is thereby configured to output latched data bit Q from data retention circuit 600 representative of one of data bits B2 or B5 and responsive to signal RESTORE.

By the configuration depicted in FIG. 6 and discussed above, data retention circuit 600 has the capabilities discussed above with respect to data retention circuits 100 and 200 and FIGS. 1 and 2. Compared to other embodiments of data retention circuit 100, data retention circuit 600 includes master latch 620 and slave latch 630 having reduced area requirements with increased clock signal complexity. Data retention circuit 600 is thereby capable of realizing the benefits discussed above with respect to data retention circuits 100 and 200.

Figure 7:
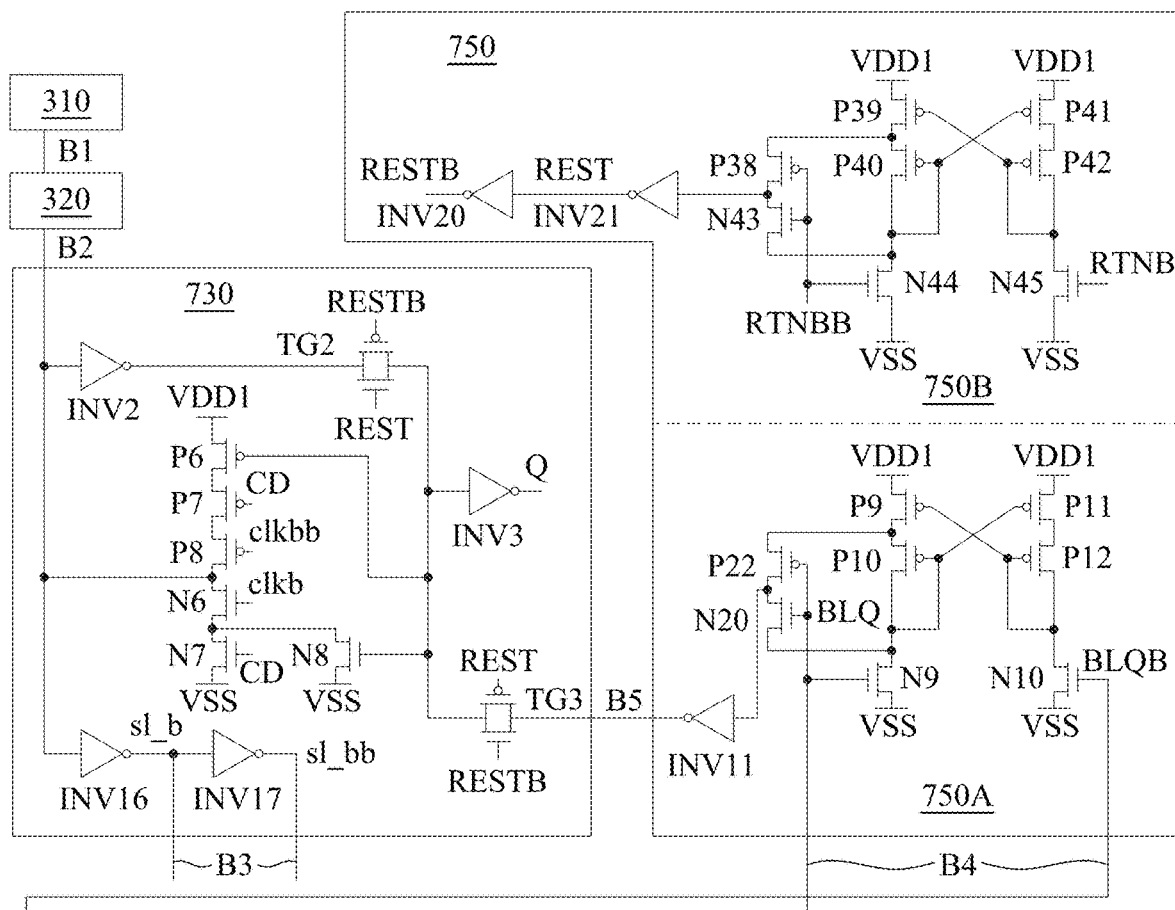
FIG. 7 is a diagram of a data retention circuit, in accordance with some embodiments.
Figure 7:
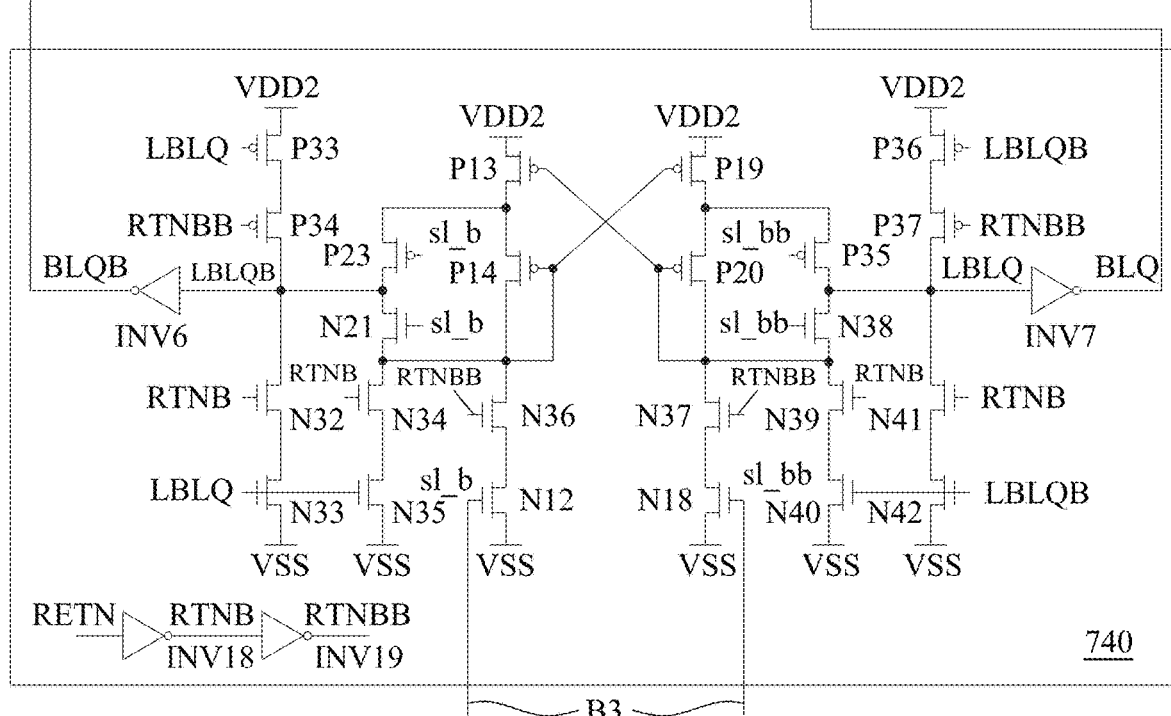

FIG. 7 is a diagram of a data retention circuit 700, in accordance with some embodiments. Data retention circuit 700 is usable as data retention circuit 100 discussed above with respect to FIG. 1.

Data retention circuit 700 includes selection circuit 310 and master latch 320, each discussed above with respect to data retention circuit 300 and FIG. 3, a slave latch 730 usable as part or all of slave latch 130, a retention latch 740 usable as part or all of retention latch 140, and a level shift circuit 750 usable as part or all of level shift circuit 150, each discussed above with respect to data retention circuit 100 and FIG. 1.

Slave latch 730 includes transistors P6-P8 and N6-N8, inverters INV2 and INV3, and transmission gates TG2 and TG3, discussed above with respect to slave latch 330 and FIG. 3, and is configured to receive complementary signals REST and RESTB instead of signal RESTORE. Slave latch 730 also includes inverters INV16 and INV17.

Transistors P6-P8 and N6-N8 and inverters INV2 and INV3 are arranged as discussed above with respect to slave latch 330 and FIG. 3. The gates of transistors P6 and N8 and the input of inverter INV3 are coupled to the output of inverter INV2 through transmission gate TG2, and configured to receive data bit B5 through transmission gate TG3. Transmission gates TG2 and TG3 are configured to receive signals REST and RESTB in an alternative gate arrangement. Inverters INV16 and INV17 are arranged in series and configured to receive data bit B2.

Transistors P6-P8 and N6-N8 are thereby configured as an inverter cross-coupled to inverter INV2 through transmission gate TG2 and to data bit B5 through transmission gate TG3 responsive to signals REST and RESTB discussed below with respect to level shift circuit 750. Inverters INV16 and INV17 are thereby configured to output data bit B3 as a complementary bit pair of signals sl_b and sl_bb.

Slave latch 730 is thereby configured to output latched data bit Q from data retention circuit 700 representative of one of data bits B2 or B5 and responsive to signals REST and RESTB.

Retention latch 740 includes transistors P13, P14, P19, P23, N12, N18, and N21 and inverters INV6 and INV7, discussed above with respect to retention latches 340 and 540 and FIGS. 3 and 5, and is configured to receive a control signal RETN instead of signal RESTORE. Retention latch 740 also includes p-type transistors P33-P37, n-type transistors N32-N42, and inverters INV18 and INV19.

Transistors P13, P14, P19, P20, P23, N12, N18, and N21 are configured as a level shifter similar to that of retention latch 540 discussed above with respect to FIG. 5, except that the gates of transistors P23 and N12 are configured to receive signal sl_b and the gate of transistor N18 is configured to receive signal sl_bb. The level shifter also includes transistors P35 and N38 arranged in series and coupled in parallel with transistor P20, each of transistors P35 and N38 including a gate configured to receive signal sl_bb. Compared to the level shifter discussed above with respect to retention latch 340 and FIG. 3, the level shifter of retention latch 740 is capable of operating within a wider range of voltage values of the first and second power supply voltage levels.

Transistors P33, P34, N32, and N33 are arranged in series and coupled between second power supply voltage level VDD2 and reference voltage level VSS, transistors P36, P37, N41, and N42 are arranged in series and coupled between second power supply voltage level VDD2 and reference voltage level VSS, transistors N34 and N35 are arranged in series and coupled between the source terminal of transistor P14 and reference voltage level VSS, and transistors N39 and N40 are arranged in series and coupled between the source terminal of transistor P20 and reference voltage level VSS.

Each of transistors P34, P23, N32, and N31 includes a source terminal coupled to the input of inverter INV6, thereby being configured to output a signal LBLQB. Each of transistors P35, P37, N38, and N41 includes a source terminal coupled to the input of inverter INV7, thereby being configured to output a signal LBLQ complementary to signal LBLQB. Each of transistors P33, N33, and N35 includes a gate configured to receive signal LBLQ, and each of transistors P36, N40, and N42 includes a gate configured to receive signal LBLQB.

Each of transistors P34, P37, N36, and N37 includes a gate configured to receive a signal RTNBB, and each of transistors N32, N34, N39, and N41 includes a gate configured to receive a signal RTNB. Inverters INV18 and INV19 are arranged in series and configured to receive signal RETN based on second power supply voltage level VDD2, thereby generating complementary signals RTNB and RTNBB.

Transistors P33, P36, N33, N35, N40, and N42 are thereby configured as a latch combined with the level shifter, and transistors P34, P37, N32, N34, N36, N37, N39, and N41, and inverters INV18 and INV19 are thereby configured to control the combined level shifter and latch responsive to signal RETN. Inverters INV6 and INV7 are thereby configured to output respective complementary signals BLQB and BLQ as data bit B4.

As depicted in FIG. 7 and discussed above, retention latch 740 is configured to respond to signal RETN having the low logical state by generating signal RTNB having the high logical state and signal RTNBB having the low logical state, thereby turning on transistors P34, P37, N32, N34, N39, and N41, and turning off transistors N36 and N37 to output the latched complementary pair of signals BLQ and BLQB as data bit B4.

Retention latch 740 is configured to respond to signal RETN having the high logical state by generating signal RTNB having the low logical state and signal RTNBB having the high logical state, thereby turning on transistors N36 and N37, and turning off transistors P34, P37, N32, N34, N39, and N41 to save the received complementary pair of signals sl_b and sl_bb as data bit B3.

Retention latch 740 is thereby configured to output latched data bit B4 representative of data bit B3 and responsive to signal RETN.

Level shift circuit 750 includes level shifters 750A and 750B. Level shifter 750A is equivalent to level shift circuit 550, discussed above with respect to data retention circuit 500 and FIG. 5, and is thereby configured to output data bit B5 representative of data bit B4.

Level shifter 750B includes p-type transistors P39-P42, n-type transistors N44 and N45, and inverters INV20 and INV21. Transistors P39-P42, N44, and N45 and inverter INV21 are configured in an arrangement that matches that of respective transistors P9-P12, N9, and N10 and inverter INV11 of level shifter 750A, and are thereby configured to output signal REST based on received signals RTNB and RTNBB, discussed above with respect to retention latch 740. Inverter INV20 is configured to receive signal REST and output signal RESTB.

Level shifter 750B is thereby configured to output complementary signal pair REST and RESTB, discussed above with respect to slave latch 730, based on first power supply voltage level VDD1 responsive to complementary signal pair RTNB and RTNBB based on second power supply voltage level VDD2.

By the configuration depicted in FIG. 7 and discussed above, data retention circuit 700 has the capabilities discussed above with respect to data retention circuits 100 and 200 and FIGS. 1 and 2. Compared to other embodiments of data retention circuit 100, data retention circuit 700 includes slave latch 730, retention latch 740, and level shift circuit 750 capable of retaining logical states of data bit Q during periods when power domain D1 is in the power down mode responsive to the single control signal RETN received in power domain D2. Data retention circuit 700 is thereby capable of realizing the benefits discussed above with respect to data retention circuits 100 and 200.

Figure 8:
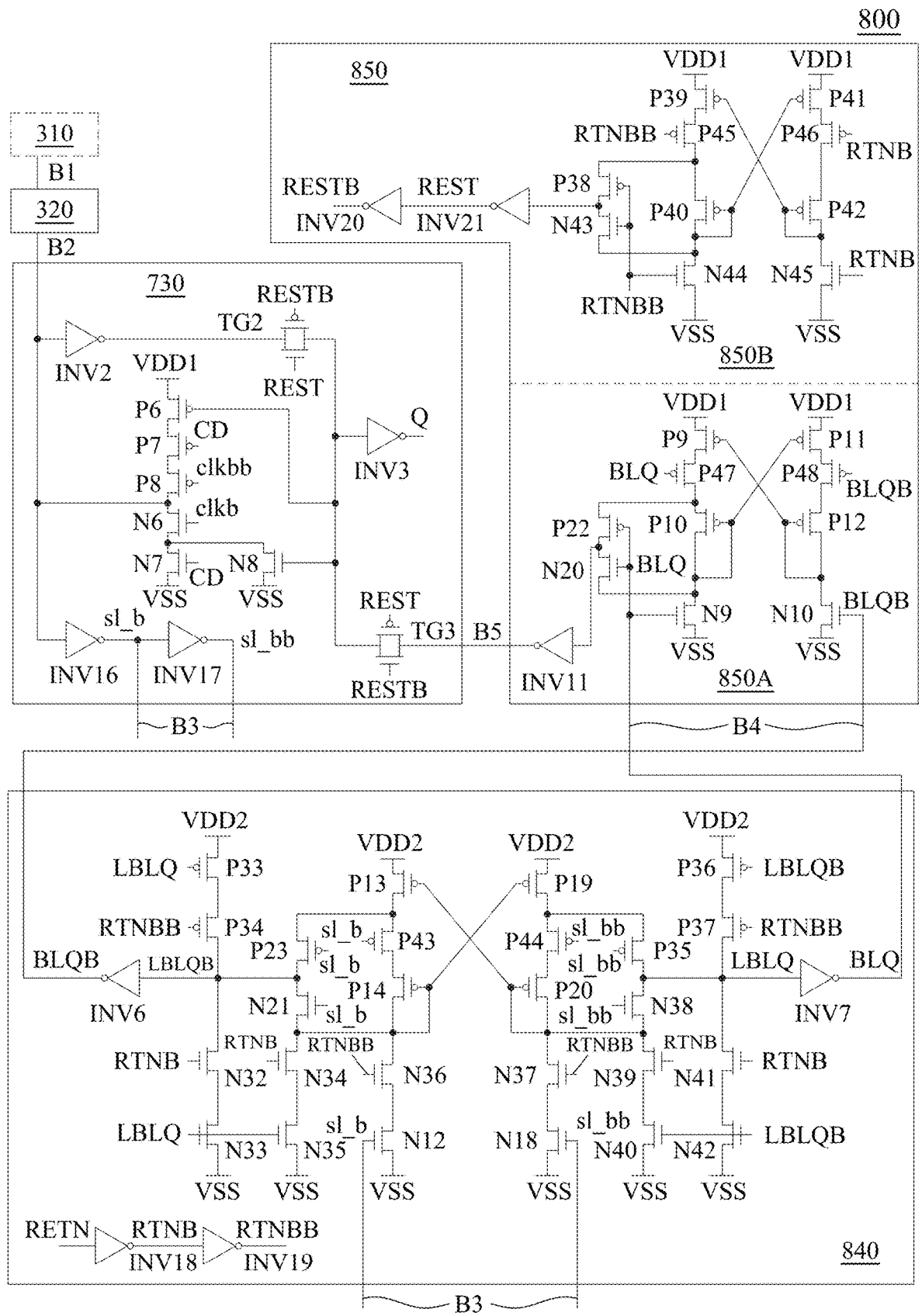
FIG. 8 is a diagram of a data retention circuit, in accordance with some embodiments.

FIG. 8 is a diagram of a data retention circuit 800, in accordance with some embodiments. Data retention circuit 800 is usable as data retention circuit 100 discussed above with respect to FIG. 1.

Data retention circuit 800 includes selection circuit 310 and master latch 320, each discussed above with respect to data retention circuit 300 and FIG. 3, slave latch 730, discussed above with respect to data retention circuit 700 and FIG. 7, a retention latch 840 usable as part or all of retention latch 140, and a level shift circuit 850 usable as part or all of level shift circuit 150, each discussed above with respect to data retention circuit 100 and FIG. 1.

In some embodiments, data retention circuit 800 does not include selection circuit 310, and master latch 320 is configured to otherwise receive data bit D as data bit B1.

Retention latch 840 includes transistors P13, P14, P19, P20, P23, P33-P37, N12, N18, N21, and N32-N42 and inverters INV6, INV7, INV18, and INV19, configured as discussed above with respect to retention latch 740 and FIG. 7, and p-type transistors P43 and P44.

Transistor P43 is coupled between a drain terminal of transistor P13 and a source terminal of transistor P14, and includes a gate configured to receive signal sl_b. Transistor P44 is coupled between a drain terminal of transistor P19 and a source terminal of transistor P20, and includes a gate configured to receive signal sl_bb.

Retention latch 840 is thereby configured to have the capabilities discussed above with respect to retention latch 740. By including transistors P43 and P44 configured to decouple respective transistor pairs P13/P14 and P19/P20 responsive to respective signals sl_b and sl_bb, retention latch 840 is capable of lower power operation compared to retention latch 740.

Level shift circuit 850 includes level shifters 850A and 850B.

Level shifter 850A includes transistors P9-P12, P22, NN9, N10, and N22 and inverter INV11, configured as discussed above with respect to level shifter 750A and FIG. 7, and p-type transistors P47 and P48.

Transistor P47 is coupled between a drain terminal of transistor P9 and a source terminal of transistor P10, and includes a gate configured to receive signal BLQ. Transistor P48 is coupled between a drain terminal of transistor P11 and a source terminal of transistor P12, and includes a gate configured to receive signal BLQB.

Level shifter 850A is thereby configured to have the capabilities discussed above with respect to level shifter 750A. By including transistors P47 and P48 configured to decouple respective transistor pairs P9/P10 and P11/P12 responsive to respective signals BLQ and BLQB, level shifter 850A is capable of lower power operation compared to level shifter 750A.

Level shifter 850B includes transistors P38-P42 and N43-N45 and inverters INV20 and INV21, configured as discussed above with respect to level shifter 750B and FIG. 7, and p-type transistors P45 and P46.

Transistor P45 is coupled between a drain terminal of transistor P39 and a source terminal of transistor P40, and includes a gate configured to receive signal RTNBB. Transistor P46 is coupled between a drain terminal of transistor P41 and a source terminal of transistor P42, and includes a gate configured to receive signal RTNB.

Level shifter 850B is thereby configured to have the capabilities discussed above with respect to level shifter 750B. By including transistors P45 and P46 configured to decouple respective transistor pairs P39/P40 and P41/P42 responsive to respective signals RTNBB and RTNB, level shifter 850B is capable of lower power operation compared to level shifter 750B.

By the configuration depicted in FIG. 8 and discussed above, data retention circuit 800 has the capabilities discussed above with respect to data retention circuits 100 and 200 and FIGS. 1 and 2. Compared to other embodiments of data retention circuit 100, data retention circuit 800 includes retention latch 840 and level shift circuit 850 capable of retaining logical states of data bit Q during periods when power domain D1 is in the power down mode responsive to the single signal RETN received in power domain D2, and with lower power consumption compared to data retention circuit 700. Data retention circuit 800 is thereby capable of realizing the benefits discussed above with respect to data retention circuits 100 and 200.

Figure 9:
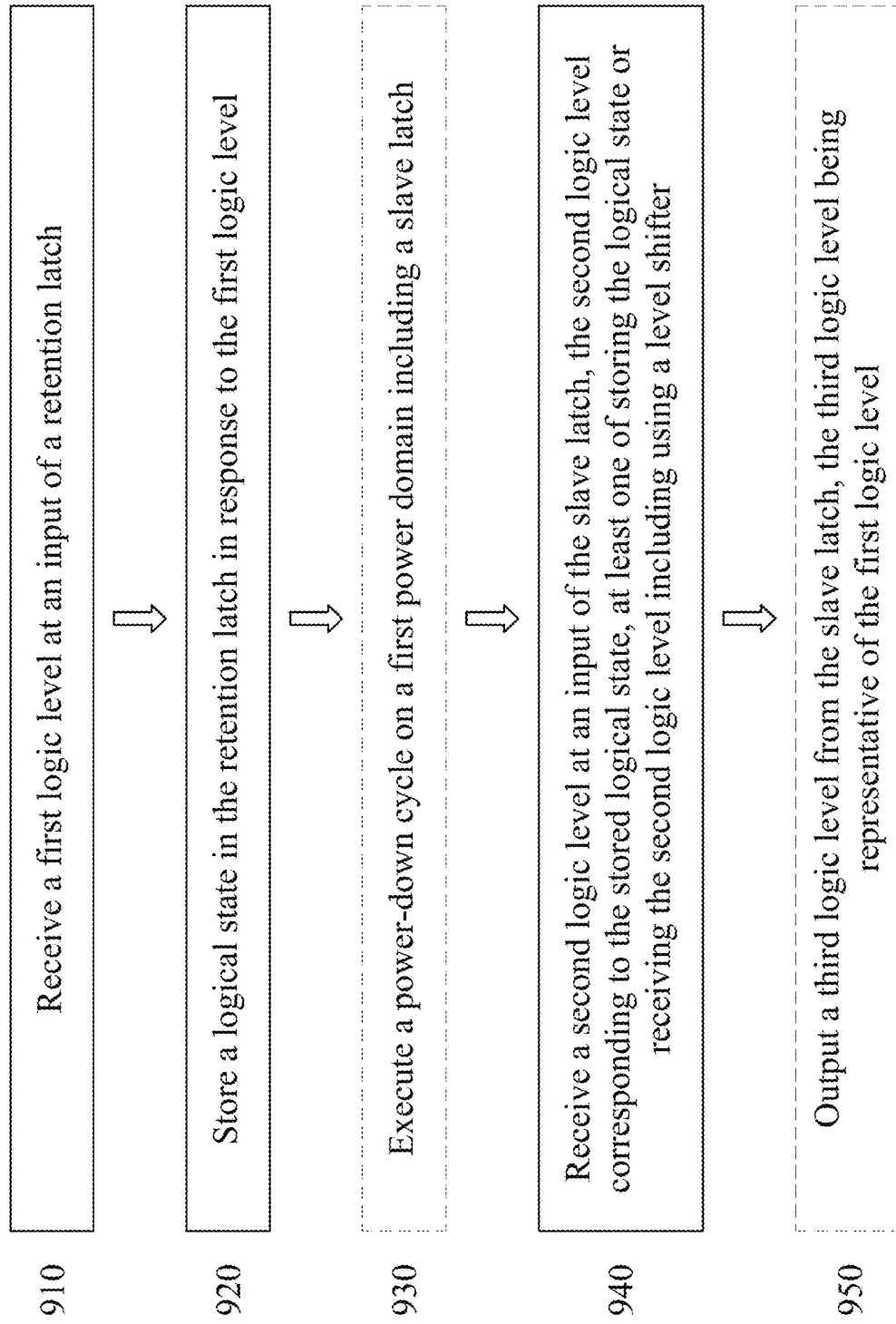
FIG. 9 is a diagram of a method of retaining a data bit, in accordance with some embodiments.

FIG. 9 is a flowchart of a method 900 of retaining a data bit, in accordance with one or more embodiments. Method 900 is usable with a data retention circuit, e.g., data retention circuit 100 discussed above with respect to FIG. 1.

The sequence in which the operations of method 900 are depicted in FIG. 9 is for illustration only; the operations of method 900 are capable of being executed in sequences that differ from that depicted in FIG. 9. In some embodiments, operations in addition to those depicted in FIG. 9 are performed before, between, during, and/or after the operations depicted in FIG. 9.

In some embodiments, some or all of the operations of method 900 are a subset of data retention operations, e.g., power-down cycling or sleep mode operations in a circuit or system.

At operation 910, a first logic level is received at an input of a retention latch, the retention latch being part of a circuit in first and second power domains. The first power domain has a first power supply voltage level and includes a master latch and a slave latch. The second power domain includes the retention latch and has a second power supply voltage level different from the first power supply voltage level. In some embodiments, the first and second power domains are respective power domains D1 and D2 discussed above with respect to FIGS. 1 and 2.

Receiving the first logic level includes receiving the first logic level corresponding to the first power supply voltage level, the first logic level being representative of a logical state of the master latch. Receiving the first logic level includes using a level shifter to increase or decrease a voltage of the first logic level from the first power supply voltage level to the second power supply voltage level. In various embodiments, using the level shifter includes using one of retention latches 140, 340, 540, 740, or 840, discussed above with respect to FIGS. 1 and 3-8.

In various embodiments, receiving the first logic level includes receiving the first logic level from the master latch or the slave latch. In various embodiments, receiving the first logic level includes receiving data bit B3 from one of master latches 120, 320, or 620, or one of slave latches 130, 330, 430, 630, or 730, discussed above with respect to FIGS. 1 and 3-8.

At operation 920, a logical state is stored in the retention latch in response to the first logic level. Storing the logical state in the retention latch includes storing the logical state in the second power domain representative of the first logic level corresponding to the first power domain. In various embodiments, storing the logical state includes storing the logical state in one of retention latches 140, 340, 540, 740, or 840, discussed above with respect to FIGS. 1 and 3-8.

In some embodiments, storing the logical state includes storing the logical state in response to a control signal. In various embodiments, storing the logical state includes storing the logical state in response to one of signals S or RETN, discussed above with respect to FIGS. 1 and 3-8.

At operation 930, in some embodiments, a power-down cycle is executed on the first power domain. Executing the power-down cycle includes the first power domain transitioning from a power on mode to a power down mode, followed by the first power domain transitioning from the power down mode to the power on mode, as discussed above with respect to data retention circuit 100 and FIG. 1.

At operation 940, a second logic level is received at an input of the slave latch, the second logic level corresponding to the stored logical state. In some embodiments, receiving the second logic level includes receiving data bit B5 at input 135 of slave latch 130, discussed above with respect to data retention circuit 100 and FIG. 1.

Receiving the second logic level includes using a level shifter to increase or decrease a voltage level of an output of the retention latch from the second power supply voltage level to the first power supply voltage level. In various embodiments, using the level shifter includes using one of level shift circuits 150, 350, or 550, or level shifters 750A or 850A, discussed above with respect to FIGS. 1 and 3-8.

In some embodiments, increasing or decreasing the output voltage level of the retention latch comprises increasing or decreasing the output voltage of one signal of a complementary pair of signals. In various embodiments, increasing or decreasing the output voltage level of the retention latch comprises increasing or decreasing an output voltage level of data bit B4 output by one of retention latches 140, 340, 540, 740, or 840, discussed above with respect to FIGS. 1 and 3-8.

At operation 950, in some embodiments, a third logic level is output from the slave latch, the third logic level being representative of the first logic level. Outputting the third logic level includes the third logic level corresponding to the first power domain and being representative of the logical state stored in the second power domain, and the stored logical state being representative of the first logic level corresponding to the first power domain.

In some embodiments, outputting the third logic level includes the slave latch responding to a control signal. In various embodiments, the slave latch responding to the control signal includes responding to one of signals RESTORE or RETN, discussed above with respect to FIGS. 1 and 3-8.

In some embodiments, responding to the control signal includes using a level shifter to increase or decrease a voltage level of a control signal. In various embodiments, using the level shifter includes using one of level shifters 750B or 850B, discussed above with respect to FIGS. 7 and 8.

In various embodiments, outputting the third logic level from the slave latch includes outputting data bit Q from one of slave latches 130, 330, 430, 630, or 730, discussed above with respect to FIGS. 1 and 3-8.

By executing some or all of the operations of method 900, a circuit is used to retain a data bit using a retention latch in a second power domain independent of a first power domain including a slave latch, thereby obtaining the benefits discussed above with respect to data retention circuits 100 and 200.

In some embodiments, a circuit includes a first power node configured to have a first voltage level, a second power node configured to have a second voltage level different from the first voltage level, a reference node configured to have a reference voltage level, a master latch configured to output a first data bit based on a received data bit, a slave latch configured to output a second data bit based on the first data bit and an output data bit based on a selected one of the first data bit or a third data bit, a first level shifter configured to output the third data bit based on a complementary bit pair, and a retention latch including a second level shifter and a pair of inverters configured to output the complementary bit pair based on the second data bit, wherein each of the slave latch and the first level shifter is coupled between the first power node and the reference node, and the retention latch is coupled between the second power node and the reference node. In some embodiments, a first inverter of the pair of inverters is coupled to a first node of the retention latch, and a second inverter of the pair of inverters is coupled to a second node of the retention latch. In some embodiments, the second level shifter includes each of the first and second nodes. In some embodiments, a first inverter of the pair of inverters is coupled to a node of the retention latch, and a second inverter of the pair of inverters is coupled in series with the first inverter of the pair of inverters. In some embodiments, the retention latch includes a third inverter configured to receive the second data bit and including a first output terminal coupled to the second level shifter, and a fourth inverter coupled in series with the third inverter and including a second output terminal coupled to the second level shifter. In some embodiments, the slave latch includes a series arrangement of inverters configured to output the second data bit as one of two complementary second data bits, and the retention latch includes a plurality of transistors including gates configured to receive the complementary second data bits. In some embodiments, the first level shifter includes a series arrangement of inverters configured to output the third data bit, and a first inverter of the series arrangement is configured to receive one data bit of the complementary bit pair. In some embodiments, the first power node is configured to have the first voltage level higher than the second voltage level. In some embodiments, the second power node is configured to have the second voltage level during a period when the first power node does not have the first voltage level.

In some embodiments, an IC includes a first power node configured to have a first voltage level, a second power node configured to have a second voltage level different from the first voltage level, a reference node configured to have a reference voltage level, first and second n-wells, a master latch configured to output a first data bit based on a received data bit, a slave latch configured to output a second data bit based on the first data bit and an output data bit based on a selected one of the first data bit or a third data bit, a first level shifter configured to output the third data bit based on a complementary bit pair, and a retention latch including a second level shifter and a pair of inverters configured to output the complementary bit pair based on the second data bit, wherein each of the slave latch and the first level shifter is coupled to each of the first power node, the reference node, and the first n-well, and the retention latch is coupled to each of the second power node, the reference node, and the second n-well. In some embodiments, each of the pair of inverters and the second level shifter includes transistors positioned in the second n-well, a first inverter of the pair of inverters is coupled to a first node of the second level shifter, and a second inverter of the pair of inverters is coupled to a second node of the second level shifter. In some embodiments, a first inverter of the pair of inverters is configured to output one data bit of the complementary bit pair, and a second inverter of the pair of inverters is coupled in series with the first inverter of the pair of inverters and configured to output the other data bit of the complementary bit pair. In some embodiments, the retention latch includes a series arrangement of inverters configured to receive the second data bit, wherein a first inverter of the series arrangement includes a first output terminal coupled to the second level shifter, and a second inverter of the series arrangement includes a second output terminal coupled to the second level shifter. In some embodiments, the slave latch includes a series arrangement of inverters configured to output the second data bit as one of two complementary second data bits, and the retention latch includes a plurality of transistors positioned in the second n-well and including gates configured to receive the complementary second data bits. In some embodiments, the first level shifter includes a series arrangement of inverters configured to output the third data bit, and a first inverter of the series arrangement is configured to receive one data bit of the complementary bit pair. In some embodiments, the first power node is configured to have the first voltage level higher than the second voltage level, and the second power node is configured to have the second voltage level during a period when the first power node does not have the first voltage level.

In some embodiments, a method of retaining a data bit includes, based on a received data bit, outputting a first data bit from a master latch, outputting, from a slave latch, a second data bit based on the first data bit and an output data bit based on a selected one of the first data bit or a third data bit, outputting, from a first level shifter, the third data bit based on a complementary bit pair, and based on the second data bit, outputting the complementary bit pair from a second level shifter and pair of inverters of a retention latch, wherein each of the slave latch and the first level shifter is coupled between a reference node and a first power node capable of having a first voltage level, and the retention latch is coupled between the reference node and a second power node capable of having a second voltage level different from the first voltage level. In some embodiments, outputting the complementary bit pair from the second level shifter includes outputting one data bit of the complementary bit pair from a first inverter of the pair of inverters coupled to a first node of the second level shifter, and outputting the other data bit of the complementary bit pair from a second inverter of the pair of inverters coupled to a second node of the second level shifter. In some embodiments, outputting the complementary bit pair from the second level shifter includes outputting one data bit of the complementary bit pair from a first inverter of the pair of inverters coupled to a node of the second level shifter, and outputting the other data bit of the complementary bit pair from a second inverter of the pair of inverters coupled in series with the first inverter of the pair of inverters. In some embodiments, outputting the third data bit from the first level shifter includes receiving one data bit of the complementary bit pair at a first inverter of a series arrangement of inverters, and outputting the third data bit from a second inverter of the series arrangement of inverters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a first power node configured to have a first voltage level;
a second power node configured to have a second voltage level different from the first voltage level;
a reference node configured to have a reference voltage level;
a master latch configured to output a first data bit based on a received data bit;
a slave latch configured to output a second data bit based on the first data bit and an output data bit based on a selected one of the first data bit or a third data bit;
a first level shifter configured to output the third data bit based on a complementary bit pair; and
a retention latch comprising a second level shifter and a pair of inverters configured to output the complementary bit pair based on the second data bit, wherein
each of the slave latch and the first level shifter is coupled between the first power node and the reference node, and
the retention latch is coupled between the second power node and the reference node.

2. The circuit of claim 1, wherein
a first inverter of the pair of inverters is coupled to a first node of the retention latch, and
a second inverter of the pair of inverters is coupled to a second node of the retention latch.

3. The circuit of claim 2, wherein the second level shifter comprises each of the first and second nodes.

4. The circuit of claim 1, wherein
a first inverter of the pair of inverters is coupled to a node of the retention latch, and
a second inverter of the pair of inverters is coupled in series with the first inverter of the pair of inverters.

5. The circuit of claim 1, wherein the retention latch further comprises:
a third inverter configured to receive the second data bit and comprising a first output terminal coupled to the second level shifter; and
a fourth inverter coupled in series with the third inverter and comprising a second output terminal coupled to the second level shifter.

6. The circuit of claim 1, wherein
the slave latch comprises a series arrangement of inverters configured to output the second data bit as one of two complementary second data bits, and
the retention latch comprises a plurality of transistors comprising gates configured to receive the complementary second data bits.

7. The circuit of claim 1, wherein
the first level shifter comprises a series arrangement of inverters configured to output the third data bit, and
a first inverter of the series arrangement is configured to receive one data bit of the complementary bit pair.

8. The circuit of claim 1, wherein the first power node is configured to have the first voltage level higher than the second voltage level.

9. The circuit of claim 1, wherein the second power node is configured to have the second voltage level during a period when the first power node does not have the first voltage level.

10. An integrated circuit (IC) comprising:
a first power node configured to have a first voltage level;
a second power node configured to have a second voltage level different from the first voltage level;
a reference node configured to have a reference voltage level;
first and second n-wells;
a master latch configured to output a first data bit based on a received data bit;
a slave latch configured to output a second data bit based on the first data bit and an output data bit based on a selected one of the first data bit or a third data bit;
a first level shifter configured to output the third data bit based on a complementary bit pair; and
a retention latch comprising a second level shifter and a pair of inverters configured to output the complementary bit pair based on the second data bit, wherein
each of the slave latch and the first level shifter is coupled to each of the first power node, the reference node, and the first n-well, and
the retention latch is coupled to each of the second power node, the reference node, and the second n-well.

11. The IC of claim 10, wherein
each of the pair of inverters and the second level shifter comprises transistors positioned in the second n-well,
a first inverter of the pair of inverters is coupled to a first node of the second level shifter, and
a second inverter of the pair of inverters is coupled to a second node of the second level shifter.

12. The IC of claim 10, wherein
a first inverter of the pair of inverters is configured to output one data bit of the complementary bit pair, and
a second inverter of the pair of inverters is coupled in series with the first inverter of the pair of inverters and configured to output the other data bit of the complementary bit pair.

13. The IC of claim 10, wherein the retention latch further comprises:
a series arrangement of inverters configured to receive the second data bit, wherein
a first inverter of the series arrangement comprises a first output terminal coupled to the second level shifter, and
a second inverter of the series arrangement comprises a second output terminal coupled to the second level shifter.

14. The IC of claim 10, wherein
the slave latch comprises a series arrangement of inverters configured to output the second data bit as one of two complementary second data bits, and
the retention latch comprises a plurality of transistors positioned in the second n-well and comprising gates configured to receive the complementary second data bits.

15. The IC of claim 10, wherein
the first level shifter comprises a series arrangement of inverters configured to output the third data bit, and
a first inverter of the series arrangement is configured to receive one data bit of the complementary bit pair.

16. The IC of claim 10, wherein
the first power node is configured to have the first voltage level higher than the second voltage level, and
the second power node is configured to have the second voltage level during a period when the first power node does not have the first voltage level.

17. A method of retaining a data bit, the method comprising:
based on a received data bit, outputting a first data bit from a master latch;
outputting, from a slave latch, a second data bit based on the first data bit and an output data bit based on a selected one of the first data bit or a third data bit;
outputting, from a first level shifter, the third data bit based on a complementary bit pair; and
based on the second data bit, outputting the complementary bit pair from a second level shifter and pair of inverters of a retention latch,
wherein
each of the slave latch and the first level shifter is coupled between a reference node and a first power node capable of having a first voltage level, and
the retention latch is coupled between the reference node and a second power node capable of having a second voltage level different from the first voltage level.

18. The method of claim 17, wherein the outputting the complementary bit pair from the second level shifter comprises:
outputting one data bit of the complementary bit pair from a first inverter of the pair of inverters coupled to a first node of the second level shifter; and
outputting the other data bit of the complementary bit pair from a second inverter of the pair of inverters coupled to a second node of the second level shifter.

19. The method of claim 17, wherein the outputting the complementary bit pair from the second level shifter comprises:
outputting one data bit of the complementary bit pair from a first inverter of the pair of inverters coupled to a node of the second level shifter; and
outputting the other data bit of the complementary bit pair from a second inverter of the pair of inverters coupled in series with the first inverter of the pair of inverters.

20. The method of claim 17, wherein the outputting the third data bit from the first level shifter comprises:
receiving one data bit of the complementary bit pair at a first inverter of a series arrangement of inverters; and
outputting the third data bit from a second inverter of the series arrangement of inverters.

* * * * *